(12) United States Patent
Lee et al.

(10) Patent No.: US 10,431,768 B2
(45) Date of Patent: *Oct. 1, 2019

(54) ORGANIC LIGHT-EMITTING DISPLAY DEVICE INCLUDING AUXILIARY ELECTRODE

(71) Applicant: LG DISPLAY CO., LTD., Seoul (KR)

(72) Inventors: KangJu Lee, Gyeonggi-do (KR); Sookang Kim, Gyeonggi-do (KR); Wonhoe Koo, Gyeonggi-do (KR); Hyunsoo Lim, Gyeonggi-do (KR); Mingeun Choi, Chungcheongnam-do (KR); Yonghoon Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/971,798

(22) Filed: May 4, 2018

(65) Prior Publication Data

US 2018/0254429 A1    Sep. 6, 2018

Related U.S. Application Data

(62) Division of application No. 15/638,765, filed on Jun. 30, 2017, now Pat. No. 9,991,464.

(30) Foreign Application Priority Data

Jun. 30, 2016 (KR) .......................... 10-2016-0083120
Sep. 22, 2016 (KR) .......................... 10-2016-0121715

(51) Int. Cl.
*H01L 51/52* (2006.01)
*H01L 51/50* (2006.01)
(Continued)

(52) U.S. Cl.
CPC ...... *H01L 51/5212* (2013.01); *H01L 27/3246* (2013.01); *H01L 27/3279* (2013.01);
(Continued)

(58) Field of Classification Search
CPC ............. H01L 51/5212; H01L 51/5008; H01L 51/0014; H01L 51/5032; H01L 27/3288
See application file for complete search history.

(56) References Cited

U.S. PATENT DOCUMENTS 8,772,820 B2 * 7/2014 Yoshizumi .......... H01L 51/5212
257/99
9,196,869 B2 * 11/2015 Yamazaki ........... H01L 51/5271
(Continued)

FOREIGN PATENT DOCUMENTS

CN            105590954 A      5/2016

OTHER PUBLICATIONS

The First Office Action dated Aug. 28, 2018, from the State Intellectual Property Office of Peoples Republic of China in counterpart Chinese application No. 201710515489.X. Note: US 20051077814 A1, US 2008/0157661 A1, U.S. Pat. No. 9,196,869 B2 and U.S. Pat. No. 9,622,345 B2 cited therein are already of record.

*Primary Examiner* — Tracie Y Green
(74) *Attorney, Agent, or Firm* — Morgan, Lewis & Bockius LLP

(57) ABSTRACT

An organic light-emitting display device includes a substrate defining an emission area and a non-emission area; an insulating layer on the substrate and having at least two grooves being defined at a portion of the insulating layer corresponding to the non-emission area; a first electrode on the insulating layer at a portion of the insulating layer corresponding to the emission area; an auxiliary electrode on the insulating layer and spaced apart from the first electrode,
(Continued)

the auxiliary electrode being on at least a portion of the insulating layer having the at least two grooves; a bank pattern on portions of the first and auxiliary electrodes; a barrier on the auxiliary electrode and separated from the bank pattern, the barrier being formed of a same material as the bank pattern; an organic light-emitting layer on the first electrode; and a second electrode on the organic light-emitting layer.

20 Claims, 19 Drawing Sheets

(51) Int. Cl.
      *H01L 51/00*       (2006.01)
      *H01L 27/32*       (2006.01)

(52) U.S. Cl.
      CPC ...... *H01L 51/0014* (2013.01); *H01L 51/5008* (2013.01); *H01L 27/3288* (2013.01); *H01L 51/5032* (2013.01); *H01L 2227/323* (2013.01)

(56) References Cited

U.S. PATENT DOCUMENTS

| | | | |
|---|---|---|---|
| 9,622,345 B2 * | 4/2017 | Yamazaki | H05K 1/09 |
| 9,991,464 B2 * | 6/2018 | Lee | H01L 27/32 |
| 2005/0077814 A1 * | 4/2005 | Koo | H01L 27/3244 |
| | | | 313/500 |
| 2006/0113900 A1 | 6/2006 | Oh | |
| 2008/0157661 A1 * | 7/2008 | Kajikawa | H01L 51/5203 |
| | | | 313/504 |

* cited by examiner

ORGANIC LIGHT-EMITTING DISPLAY DEVICE INCLUDING AUXILIARY ELECTRODE

This application is a divisional application of U.S. patent application Ser. No. 15/638,765 filed on Jun. 30, 2017, which claims the priority of Korean Patent Application No. 10-2016-0083120, filed in Korea on Jun. 30, 2016, and Korean Patent Application No. 10-2016-0121715, filed in Korea on Sep. 22, 2016, all of which are hereby incorporated by reference for all purposes as if fully set forth herein.

BACKGROUND

Technical Field

The present disclosure relates to an organic light-emitting display device and a method of fabricating the same.

Description of Related Art

In response to the development of the information society, demand for various types of display devices to display images has increased. Recently, a range of display devices, such as liquid crystal display (LCD) devices, plasma display panels (PDPs), and organic light-emitting display devices, have come into widespread use. Each of these display devices includes a display panel.

A display panel has thin-film transistors (TFTs) provided in respective pixel areas corresponding thereto, and a specific pixel area in the display panel is controlled by a flow of current in the TFTs. Each of the TFTs includes a gate and source/drain electrodes.

An organic light-emitting display device has a light-emitting layer sandwiched between two electrodes. When electrons migrate to the light-emitting layer from one electrode and holes migrate to the light-emitting layer from the other electrode, the electrons recombine with the holes, thereby generating excitons. Thereafter, the excitons transit from an excited state to a ground state, thereby emitting light.

There are, in general, limited problems when the organic light-emitting display device has a small display area. However, when the organic light-emitting display device has a large display area, uniform luminance cannot be maintained, and a difference in luminance levels between a peripheral area and a central area may occur. More particularly, when current flows from the cathode of an organic electroluminescent device or an organic light-emitting diode (OLED) to the peripheral area and the central area, the current arrives at a location remote from the portion at which the current is introduced. Here, a voltage drop is caused by the resistance of the cathode of the OLED so that a difference in luminance levels between the peripheral area and the central area occurs.

In a related art organic electroluminescent display device, a difference in luminance between the peripheral portion and the central portion due to the resistance of the top electrode of the OLED significantly reduces luminance uniformity. Thus, a compensation for the reduced luminance uniformity is required.

To overcome the problem of voltage drop, an auxiliary electrode (or an auxiliary line) in contact with the cathode has been introduced. However, the contact between the cathode and the auxiliary electrode may be obstructed by organic material formed on the auxiliary electrode. In addition, a portion of the organic material may be thicker than the other portions, thereby causing leakage current.

Recently, a barrier rib has been used on the auxiliary electrode to overcome this problem. However, an additional process of forming the barrier rib must be added, which is problematic. Accordingly, there is a need for a solution that can bring the cathode into contact with the auxiliary electrode without any additional processes.

SUMMARY

Accordingly, embodiments of the present disclosure are directed to an organic light-emitting display device and a method of fabricating the same that substantially obviate one or more of the problems due to limitations and disadvantages of the related art.

An aspect of the present disclosure is to provide an organic light-emitting display device able to prevent a voltage drop caused by a resistance of a cathode in a large area organic light-emitting display device, prevent occurrence of a leakage current, and simplify a process at the same time, and a method for manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light-emitting display device comprises a substrate defining an emission area and a non-emission area; an insulating layer on the substrate and having at least two grooves being defined at a portion of the insulating layer corresponding to the non-emission area; a first electrode on the insulating layer at a portion of the insulating layer corresponding to the emission area; an auxiliary electrode on the insulating layer and spaced apart from the first electrode, the auxiliary electrode being on at least a portion of the insulating layer having the at least two grooves; a bank pattern on portions of the first and auxiliary electrodes; a barrier on the auxiliary electrode and separated from the bank pattern, the barrier being formed of a same material as the bank pattern; an organic light-emitting layer on the first electrode; and a second electrode on the organic light-emitting layer.

In another aspect, a method of fabricating an organic light-emitting display device, the method comprises providing an insulating layer on a substrate, the substrate defining an emission area and a non-emission area, and the insulating layer having at least two grooves at a portion of the insulating layer corresponding to a non-emission area of the substrate; providing a first electrode and an auxiliary electrode on the insulating layer, the auxiliary electrode being spaced apart from the first electrode and being on the insulating layer at a portion of the insulating layer having the at least two grooves; providing a bank pattern on portions of the first and auxiliary electrodes and a barrier on the auxiliary electrode; providing an organic light-emitting layer on the first electrode; and providing a second electrode on the organic light-emitting layer.

In another aspect, a method of fabricating an organic light-emitting display device, the method comprises providing an insulating layer on a substrate, the substrate defining an emission area and a non-emission area; providing a first electrode and an auxiliary electrode pattern on the insulating layer, the auxiliary electrode pattern being spaced apart from the first electrode; providing a bank pattern material on the first electrode and the auxiliary electrode pattern; patterning the bank pattern material with a mask such that a bank pattern and a barrier are formed at a portion corresponding to a blocking portion of the mask, and the auxiliary electrode pattern is exposed at a portion corresponding to a transmitting portion of the mask; etching the exposed portion of the auxiliary electrode pattern using the bank pattern as a mask to provide an auxiliary electrode and to expose a portion of the insulating layer; etching the insulating layer to form at least two grooves therein using the auxiliary electrode pattern as a mask; and removing a portion of the bank pattern to expose a portion of the first electrode; providing an organic light-emitting layer on the exposed portion of the first electrode; and providing a second electrode on the organic light-emitting layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
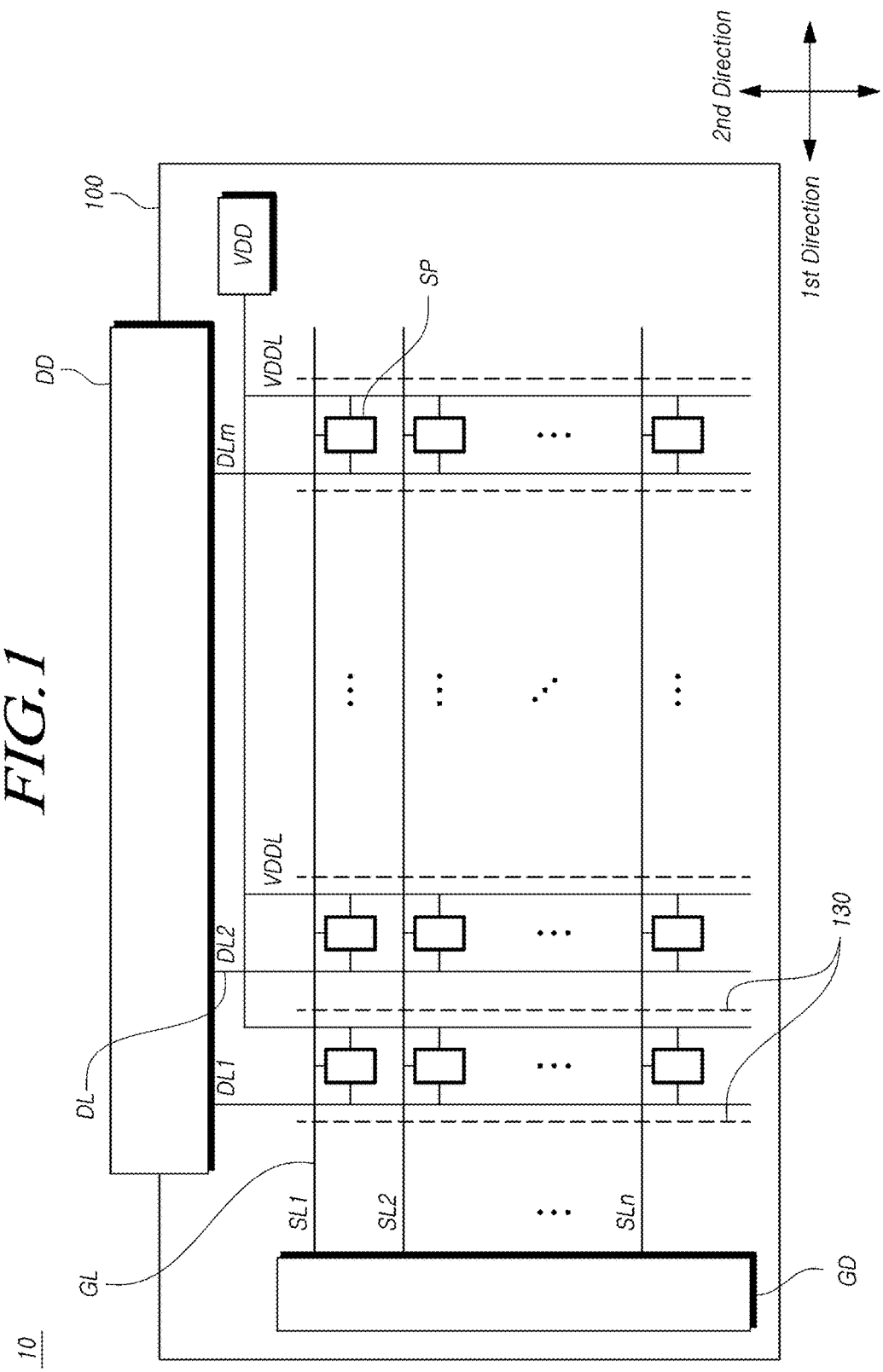
FIG. 1 is a schematic view illustrating an organic light-emitting display device according to an example embodiment.

Reference will now be made in detail to embodiments of the present disclosure, examples of which are illustrated in the accompanying drawings. The embodiments set forth herein are provided for illustrative purposes to fully convey the concept of the present disclosure to a person skilled in the art. The present disclosure should not be construed as being limited to these embodiments and may be embodied in many different forms. In the drawings, the size and thickness of the device may be exaggerated for the sake of clarity. Throughout this document, the same reference numerals and symbols will be used to designate the same or like components.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in many different forms. Rather, these embodiments are provided so that the present disclosure will be thorough and complete, and will fully convey the scope of the present disclosure to a person skilled in the art. The scope of the present disclosure shall be defined by the appended claims. Throughout this document, the same reference numerals and symbols will be used to designate the same or like components. In the drawings, the sizes and relative sizes of layers and areas may be exaggerated for the sake of clarity.

It will be understood that when an element or a layer is referred to as being "on" another element or layer, not only can it be "directly on" the other element or layer, but it can also be "indirectly on" the other element or layer via an "intervening" element or layer. In contrast, when an element or a layer is referred to as being "directly on" another element or layer, it will be understood that no intervening element or layer is interposed.

Spatially relative terms such as "below," "beneath," "under," "lower," "above," and "upper" may be used herein for the ease of description of the relationship of an element or components to another element or other components as illustrated in the drawings. The spatially relative terms should be construed as terms encompassing different orientations of the element in use or operation in addition to the orientation depicted in the drawings. For example, when elements illustrated in the drawings are turned over, an element described as "below," "beneath," or "under" another element would then be oriented "above" the other element. Thus, the example term "below," "beneath," or "under" can encompass both orientations of above and below.

Terminologies used herein are for the purpose of describing specific embodiments and are not intended to be limiting the present disclosure. Descriptions of components in the singular form are intended to include descriptions of components in the plural form, unless explicitly described to the contrary. It will be understood that terms "comprise," "include," and their variations used herein preclude the presence or addition of one or more other components, steps, operations and/or elements.

FIG. 1 is a schematic view illustrating an organic light-emitting display device 10 according to an example embodiment.

As shown in FIG. 1, the organic light-emitting display device 10 according to the example embodiment may include a substrate 100, a gate driver GD, a plurality of gate lines GL, a data driver DD, a plurality of data lines DL, auxiliary electrodes 130, and a plurality of subpixels SP.

The substrate 100 may be an insulating substrate made of plastic, glass, ceramic, and/or like. If the substrate 100 is made of the plastic, the substrate 100 may have flexible characteristics. The material of the substrate 100 is not limited thereto, and the substrate 100 may be made of a metal or other material.

In addition, the gate driver GD sequentially provides scan signals to the plurality of gate lines GL. For example, the gate driver GD supplies the scan signals to the plurality of gate lines GL in response to a control signal supplied from a control circuit, e.g., a timing controller or the like (not shown). Thereafter, the subpixels SP are selected by the scan signals and sequentially receive data signals.

The plurality of gate lines GL is disposed on the substrate 100 and extend in a first direction. The gate lines GL include a plurality of scan lines SL1 to SLn. The plurality of scan lines SL1 to SLn are connected to the gate driver GD and receive scan signals.

In addition, the data driver DD supplies data signals to data lines DL1 to DLm selected from the data lines DL in response to a control signal supplied from an outside such as a timing controller (not shown). The data signals supplied to the data lines DL1 to DLm is supplied to the subpixels SP selected by the scan signals whenever the scans signal are supplied to the scan lines SL1 to SLn. Accordingly, the subpixels SP are charged with a voltage corresponding to the data signal and emit light having brightness corresponding to the voltage.

Here, the data lines DL are disposed in a second direction crossing the gate lines GL. The data lines DL include a plurality of data lines DL1 to DLm and a driving power line VDDL. The plurality of data lines DL1 to DLm are connected to the data driver DD and receive data signals from the data driver DD. In addition, the driving power line VDDL is connected to a first external power supply VDD and receives driving power from the first external power supply VDD.

Meanwhile, an organic light-emitting display device may be classified into a top emission type, a bottom emission type, and a dual emission type. Here, in an increased large area display panel even with any emission type being utilized, a voltage drop may occur at a cathode in a process of forming the cathode on a front surface of a display panel. To overcome such limitation, an auxiliary electrode or an auxiliary wiring may be formed in a non-emission area. Hereinafter, the following example embodiments will be described based upon a top emission organic light-emitting display device. However, example embodiments of the present disclosure are not limited to a top emission organic light-emitting display device and may be applied to structures of all display devices preventing a voltage drop of a cathode.

The auxiliary electrodes 130 may be disposed parallel to the plurality of data lines DL1 to DLm on the substrate 100. That is, the auxiliary electrodes 130 may be disposed in the second direction. Here, although not illustrated in FIG. 1, auxiliary wirings may be further disposed parallel to the data lines DL1 to DLm.

In some configurations, the auxiliary electrodes 130 may be disposed parallel to the plurality of scan lines SL1 to SLn on the substrate 100, but example embodiments are not limited thereto. That is, the auxiliary electrodes 130 may be disposed in the first direction. The organic light-emitting display device 10 may prevent occurrence of a brightness difference between a peripheral portion and a central portion through the auxiliary electrodes 130, the occurrence of the brightness difference being caused by a voltage drop due to degradation of a cathode (not shown) in an organic electroluminescent device (not shown) or an organic light-emitting diode (OLED) (not shown).

Figure 2:
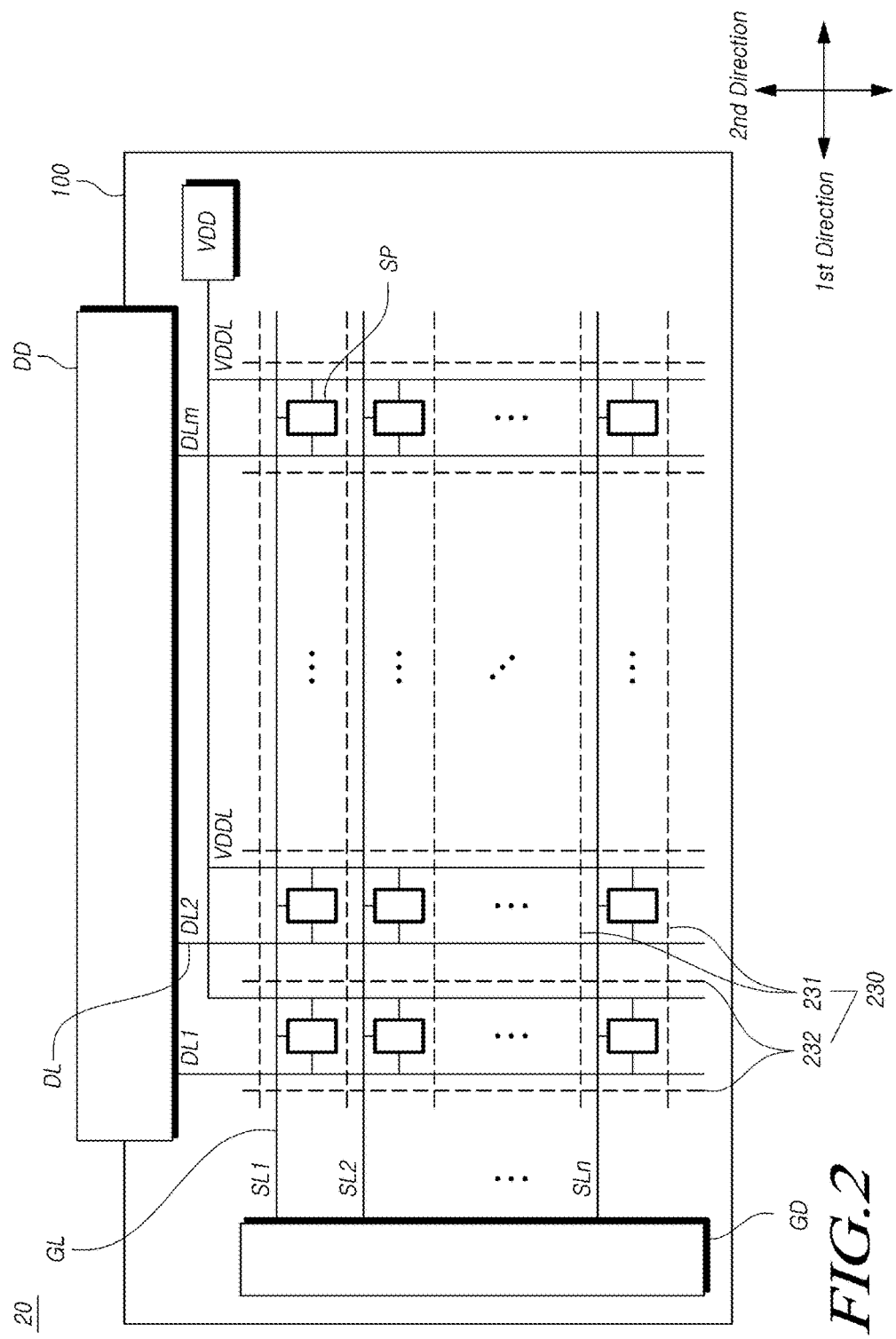
FIG. 2 is a schematic view illustrating an organic light-emitting display device according to another example embodiment.

An organic light-emitting display device according to another example embodiment will be described with reference to FIG. 2. FIG. 2 is a schematic view illustrating an organic light-emitting display device 20 according to another example embodiment. The organic light-emitting display device 20 according to another example embodiment may include the same configurations as those of the above-described organic light-emitting display device 10 according to the example embodiment. A repeated description of the above-described example embodiment may be omitted. The same reference numerals denote the same components.

With reference to FIG. 2, the organic light-emitting display device 20 includes a plurality of scan lines SL1 to SLn disposed on a substrate 100 in a first direction and data lines DL1 to DLm disposed in a second direction crossing the first direction. The organic light-emitting display device 20 includes a plurality of auxiliary electrodes 230 disposed on the substrate 100.

Specifically, the organic light-emitting display device 20 includes a plurality of first auxiliary electrodes 231 disposed in parallel to the plurality of scan lines SL1 to SLm and a plurality of second auxiliary electrodes 232 disposed in parallel to the plurality of data lines DL1 to DLm. That is, the auxiliary electrodes 230 may be disposed on the substrate 100 in a mesh form.

As described above, the auxiliary electrodes 230 may be disposed in various forms. In addition, although not illustrated in FIG. 2, auxiliary wirings may be further disposed in parallel to the data lines DL1 to DLm. The organic light-emitting display device 20 can prevent a brightness difference between a peripheral portion and a central portion through the auxiliary electrodes 230 from being caused by a voltage drop due to degradation of a cathode (not shown) in an organic electroluminescent device (not shown).

An organic light-emitting display device including an auxiliary electrode and an auxiliary wiring will be described in detail with reference to FIG. 3.

Figure 3:
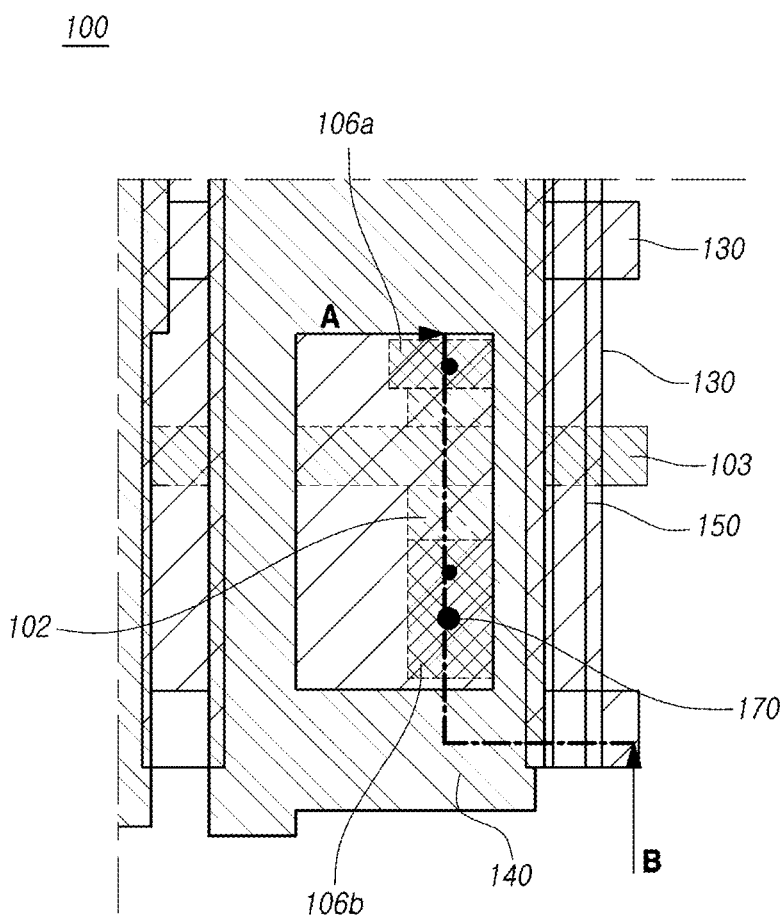
FIG. 3 is a plan view illustrating an organic light-emitting display device according to a first example embodiment.

FIG. 3 is a plan view illustrating an organic light-emitting display device according to a first example embodiment. The organic light-emitting display device according to the first example embodiment includes an active layer 102 disposed on a substrate 100, a gate electrode 103, a data line, a source electrode 106a branched from the data line, a drain electrode 106b spaced apart from the source electrode 106a, and an auxiliary electrode 130.

A first electrode of an organic electroluminescent device contacts the drain electrode 106b though a first contact hole 170 through which the drain electrode 106b is exposed. Here, the first electrode may be an anode of the organic electroluminescent device.

The auxiliary electrode 130 is disposed on the same layer as and made of the same material as the first electrode. The auxiliary electrode 130 may be disposed in each of a horizontal direction and a vertical direction, e.g., in a mesh form. A placement form of the auxiliary electrode 130 is not limited thereto, but the auxiliary electrode 130 may only be disposed in one direction of the horizontal direction and the vertical direction.

Bank patterns 140 are disposed to expose a portion of the auxiliary electrode 130. A portion of the auxiliary electrode 130, not exposed though the bank patterns 140, may contact a second electrode (not shown) of the organic electroluminescent device to prevent a voltage drop of the second electrode (not shown).

On the other hand, for contact between the auxiliary electrode 130 and the bank patters 140 to be formed, a barrier rib 150 made of the same material as the bank patterns 140 is disposed on the portion of the auxiliary electrode 130, exposed by the bank patterns 140.

An auxiliary electrode contacting the second electrode of the organic electroluminescent device according to the present example embodiments is disposed between pixels regions. A material constituting the auxiliary electrode may be the same as a material constituting a first electrode, a source electrode, a drain electrode, or a connection electrode electrically connecting the electrodes, but the present example embodiments are not limited thereto.

Figure 4:
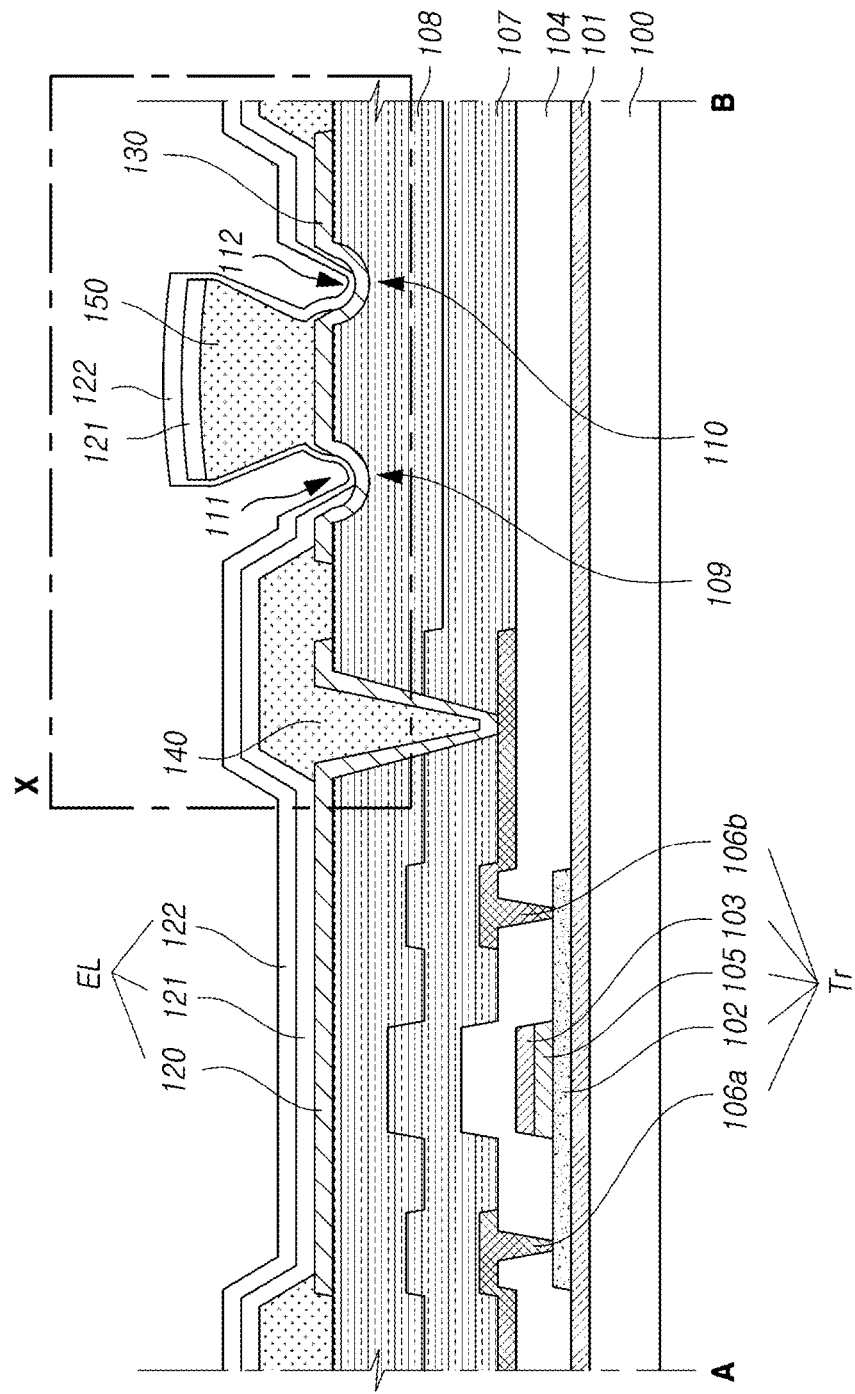
FIG. 4 is a cross-sectional view taken along line A-B of FIG. 3.

The organic light-emitting display device according to the first example embodiment will be described in detail with reference to FIG. 4. FIG. 4 is a cross-sectional view taken along line A-B of FIG. 3.

As shown in FIG. 4, the substrate 100 may include a pixel region and a contact region. The pixel region is a region in which a thin film transistor Tr and an organic electroluminescent device EL are disposed on the substrate 100. The contact region of the substrate 100 is a region in which the auxiliary electrode 130 and the second electrode 122 are connected to each other.

Specifically, a buffer layer 101 is disposed on the substrate 100, and the active layer 102 is disposed on the buffer layer 101. A gate insulating film 105 is disposed on the active layer 102. The gate insulating film 105 may be disposed to overlap a channel layer (not shown) of the active layer 102. The gate electrode 103 is disposed on the gate insulating film 105.

The gate electrode 103 may be formed by laminating at least one selected from copper (Cu), molybdenum (Mo), aluminum (Al), titanium (Ti), and an alloy including combinations thereof. A material of the gate electrode 103 is not limited thereto, but the gate electrode 103 may be made of a material of a gate electrode or a gate line, which is generally used. In addition, the gate electrode 103 is illustrated in FIG. 4 as including a single metal layer, but may be formed by laminating two or more metal layers in some cases.

A first interlayer insulating layer 104 is disposed on the gate electrode 103. The source electrode 106a and the drain electrode 106b are disposed on the first interlayer insulating layer 104 to be spaced apart from each other. The source electrode 106a and the drain electrode 106b contact the active layer 102 through a first contact hole formed in the first interlayer insulating layer 104.

Here, the source electrode 106a and the drain electrode 106b may be formed by laminating at least one selected from copper (Cu), molybdenum (Mo), aluminum (Al), silver (Ag), titanium (Ti), an alloy including combinations thereof, and a transparent conductive material, such as indium tin oxide (ITO), indium zinc oxide (IZO), or ITZO. A material of the source electrode 106a and the drain electrode 106b is not limited thereto, but the source electrode 106a and the drain electrode 106b may be made of a material of a data line, which is generally used. In addition, the source electrode 106a and the drain electrode 106b are illustrated in FIG. 4 as including a single metal layer, but are formed by laminating two or more metal layers in some cases. As described above, the thin film transistor Tr may be disposed on the substrate 100.

A second interlayer insulating layer 107 and/or an overcoat layer 108 may be disposed on the substrate 100 including the thin film transistor Tr to protect the source electrode 106a and the drain electrode 106b. Here, all of the first interlayer insulating layer 104, the second interlayer insulating layer 107, and the overcoat layer 108 may be an insulating layer. A first electrode 120 and the auxiliary electrode 130 of the organic electroluminescent device EL are disposed on the overcoat layer 108. A contact hole for connecting the first electrode 120 and the drain electrode 106b of the thin film transistor Tr is formed in the overcoat layer 108. The first electrode 120 and the drain electrode 106b may be connected to each other through the contact hole.

Here, the first electrode 120 may be made of a transparent conductive material having a high work function. For example, the first electrode 120 may be made of any one selected from the group consisting of indium tin oxide (ITO), indium zinc oxide (IZO), and zinc oxide (ZnO). The first electrode 120 is illustrated in FIG. 4 as including a single layer, but may include a multiple-layer further including a reflection layer and a transparent conductive material layer.

Although the auxiliary electrode 130 may be made of the same material as the first electrode 120, the present disclosure is not limited thereto. The auxiliary electrode 130 may be made of the same material as the gate electrode 103 and the source/drain electrodes 106a and 106b. The auxiliary electrode 130 may electrically connect the second electrode of the organic electroluminescent device EL.

The bank patterns 140 are disposed on both side surfaces of the first electrode 120 and the auxiliary electrode 130. That is, the bank patterns 140 may be disposed to expose a portion of the top surface of each of the first electrode 120 and the auxiliary electrode 130. The barrier rib 150 is disposed on a portion of the top surface in the auxiliary electrode 130 having the top surface, a portion of which is exposed due to the bank patterns 140. At this time, the bank patterns 140 may have a normal tapered shape (e.g., the shape is tapers such that the top surface is smaller than the bottom surface) and the barrier rib 150 may have a reverse tapered shape.

On the other hand, an additional process is necessary to form the barrier rib 150 functioning to prevent a voltage drop from being caused by a resistance of a cathode (corresponding to a second electrode of an embodiment) in the organic electroluminescent device EL.

In addition, to facilitate a contact between the auxiliary electrode 130 and the cathode of the organic electroluminescent device EL, the barrier rib 150 disposed on the auxiliary electrode 130 may have a reverse tapered shape. However, it is difficult to form the barrier rib 150 in the reverse tapered shape.

To overcome the difficulty, in the organic light-emitting display device according the first example embodiment, an insulating layer, e.g., the overcoat layer 108, may have at least two grooves 109 and 110 in a non-emission area. The auxiliary electrode 130 may be disposed on portions of the overcoat layer 108, in which the at least two grooves 109 and 110 are formed. The barrier rib 150 disposed on the auxiliary electrode 130 may be disposed on the same layer as and made of the same material as the bank patterns 140. Specifically, the bank patterns 140 and the barrier rib 150 may be made of an opaque organic material.

As described above, at least two grooves 109 and 110 may be formed on portions of the overcoat layer 108. Specifically, at least two grooves 109 and 110 may be formed in regions overlapping regions in which the auxiliary electrode 130 is disposed. The auxiliary electrode 130 may be formed on the overcoat layer 108 to have a shape corresponding to a shape of at least two grooves 109 and 110.

Specifically, the auxiliary electrode 130 may have at least two grooves 111 and 112 and at least one flat region disposed between at least two grooves 111 and 112. The barrier rib 150 may be disposed in at least one flat region disposed between at least two grooves 111 and 112. At this time, the barrier rib 150 may be made of an opaque organic material and have a reverse tapered shape.

An organic light-emitting layer 121 and the second electrode 122 of the organic electroluminescent device EL may be sequentially disposed on top surfaces of the first electrode 120, the bank patterns 140, and the barrier rib 150, and a portion of the top surface of the auxiliary electrode 130.

Figure 5:
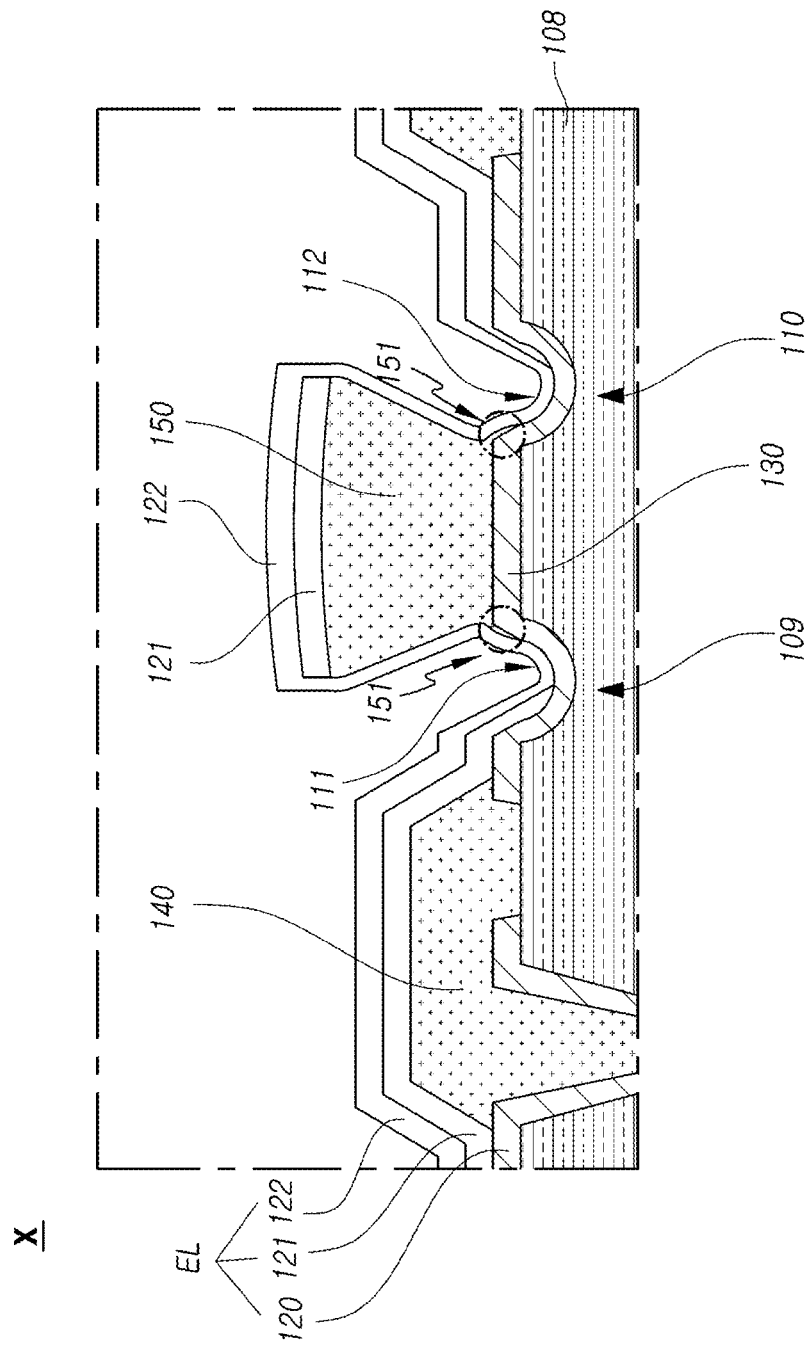
FIG. 5 is an enlarged view of region X of FIG. 4.

On the other hand, configurations of an auxiliary electrode, bank patterns, and a barrier rib, according to an embodiment including a barrier rib that does not need additional processes and has a reverse tapered shape easily manufactured, will be described in detail. FIG. 5 is an enlarged view of an X region of FIG. 4.

With reference to FIG. 5, the overcoat layer 108 may have at least two grooves 109 and 110 in regions overlapping the auxiliary electrode 130. The auxiliary electrode 130 disposed on the overcoat layer 108 may have morphology corresponding to a shape of at least two grooves 109 and 110 formed in the overcoat layer 108. For example, an upper surface of the auxiliary electrode at a portion over the at least two groove may have a shape substantially corresponding to an upper surface of the insulating layer having the at least two grooves. At this time, the shape of at least two grooves 109 and 110 may be a semicircular shape or a semielliptical shape, and thus, the auxiliary electrode 130 may be seamlessly formed on at least two grooves 109 and 110. Specifically, side surfaces of at least two grooves 109 and 110 may have a gentle slope, thereby preventing disconnection of the auxiliary electrode 130.

Meanwhile, the auxiliary electrode 130 has at least one flat region. At this time, the at least one flat region may be disposed between the two grooves 111 and 112. The barrier rib 150 is disposed on the at least one flat region of the auxiliary electrode 130. As described above, because the barrier rib 150 is disposed on the at least one flat region between the two grooves 111 and 112, the barrier rib 150 having a certain width may be stably disposed.

At this time, the barrier rib 150 may be disposed on the same layer as and made of the same material as the bank patterns 140 disposed on the both side surfaces of the first electrode 120 and the auxiliary electrode 130. Specifically, the barrier rib 150 and the bank patterns 140 may be made of the same opaque organic material. The barrier rib 150 may be formed by the same process as the bank patterns 140. Therefore, an additional process of forming the barrier rib 150 is not necessary, thereby simplifying a process.

On the other hand, the bank patterns 140 have a normal tapered shape and the barrier rib 150 may have a reverse tapered shape. Because the organic light-emitting layer 121 covers the whole top surface of the auxiliary electrode 130, the barrier rib 150 may have the reverse tapered shape to prevent a noncontact between the auxiliary electrode 130 and the second electrode 122.

Specifically, the organic light-emitting layer 121 of the electroluminescent device EL may be formed by a deposition method or a coating method having linearity. For example, the organic light-emitting layer 121 may be formed by an evaporation method. Therefore, at the time of forming the organic light-emitting layer 121, because a material of the organic light-emitting 121 is blocked by the barrier rib 150 having the reverse tapered shape, a region in which the organic light-emitting layer 121 is not disposed is generated on the auxiliary electrode 130.

More specifically, the organic light-emitting layer 121 is not disposed in a region adjacent to the barrier rib 150.

Accordingly, the organic light-emitting layer 121 may expose a portion of the auxiliary electrode 130 to facilitate a contact between the auxiliary electrode 130 and the second electrode 122.

The second electrode 122 of the electroluminescent device EL may be formed by a deposition method or a coating method having no constant directionality. For example, the second electrode 122 may be formed by a sputtering method. Because the sputtering method has excellent step coverage, the second electrode 122 may be easily formed even with respect to a structure having a stepped-shape or a reverse tapered shape.

The second electrode 122 may sufficiently contact the auxiliary electrode 130, thereby preventing a brightness difference between a peripheral portion and a central portion of a panel from being caused by a voltage drop due to the second electrode 122.

On the other hand, the barrier rib 150 may have protrusions 151 and 152 on portions thereof. Specifically, the barrier rib 150 may have the protrusions 151 and 152 on portions thereof in regions in which the barrier rib 150 and the auxiliary electrode 130 contact each other.

At this time, the protrusions 151 and 152 may be disposed to overlap portions of the grooves 111 and 112 of the auxiliary electrode 130, respectively. After an exposing process and a developing process for forming the barrier rib 150 in a reverse tapered shape using a stepped portion caused by the grooves 111 and 112 formed in the auxiliary electrode 130, the protrusions 151 and 152 may be formed on portions of the barrier rib 150.

Figure 6:
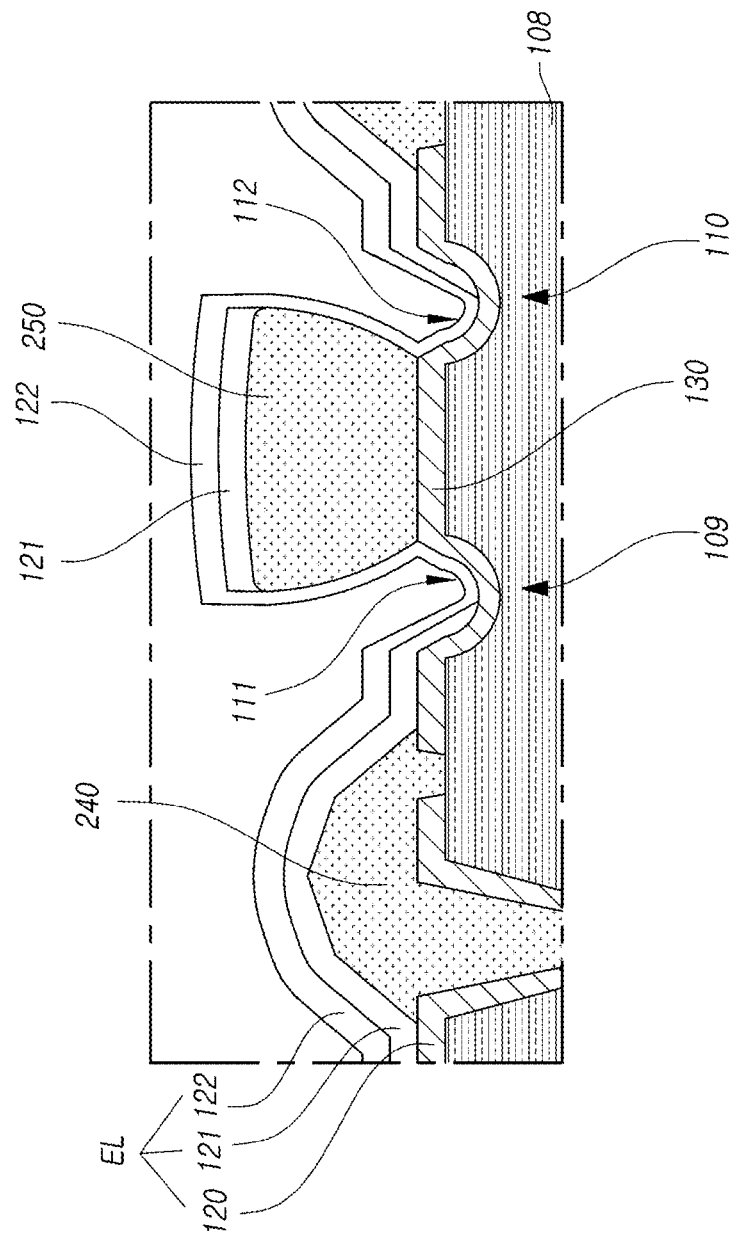
FIG. 6 is a view illustrating bank patterns and a barrier rib according to another example embodiment.

A shape of the bank patterns 140 and the barrier rib 150 is not limited to the shape illustrated in FIG. 5, and the bank patterns 140 and the barrier rib 150 may have a shape as illustrated in FIG. 6.

FIG. 6 is a view illustrating bank patterns 240 and a barrier rib 250 according to another example embodiment. A repeated description of the above-described example embodiment may be omitted. The same reference numerals denote the same components.

With reference to FIG. 6, in an organic light-emitting display device according to another example embodiment, the bank patterns 240 and the barrier rib 250 may be disposed on the same layer and made of the same material. At this time, the bank patterns 240 and the barrier rib 250 may be made of an opaque organic material. In addition, the bank patterns 240 and the barrier rib 250 may be formed by the same process.

In a process of forming the bank patterns 240 and the barrier rib 250, a shape of the bank patterns 240 and the barrier rib 250 may be changed according to an exposing time and a developing time. Specifically, a cross section of the bank patterns 240 may have a tetragonal shape, a pentagonal shape, or the like according to a process condition. A shape of the bank patterns 240 according to the present example embodiment is not limited thereto, but it is sufficient as long as the bank patterns 240 have a polygonal shape or a polygonal shape having round corners.

In addition, the barrier rib 150 may have a reverse tapered shape and may have no protrusion in a region in which the barrier rib 150 and the auxiliary electrode 130 contact each other. That is, it is sufficient as long as the bank patterns 240 according to the present example embodiment have a shape gradually widened in a vertical direction.

As described above, the bank patterns and the barrier rib according to the present example embodiments may be formed by the same process, thereby simplifying a manufacturing process. Theses configurations will be described with reference to FIGS. 7 to 10.

FIGS. 7 to 10 are schematic views illustrating a manufacturing method for forming bank patterns 140 and a barrier rib 150 according to a first example embodiment. The following manufacturing method may include the same configurations as those of above-described example embodiment. A repeated description of the above-described example embodiment may be omitted. The same reference numerals denote the same components.

Figure 7:
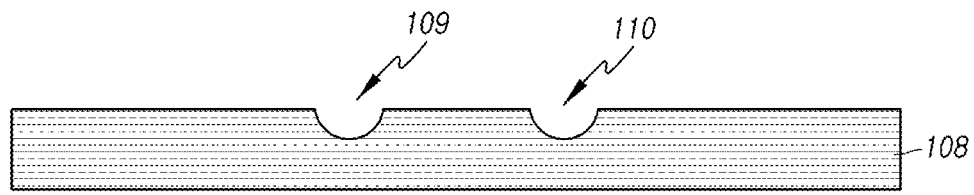
FIGS. 7 to 10 are schematic views illustrating a manufacturing method for forming bank patterns and a barrier rib according to a first example embodiment.

In FIG. 7, at least two grooves 109 and 110 are formed in an overcoat layer 108. At least two grooves 109 and 110 formed in the overcoat layer 108 may be spaced apart from each other and be formed by using photolithography.

Figure 8:
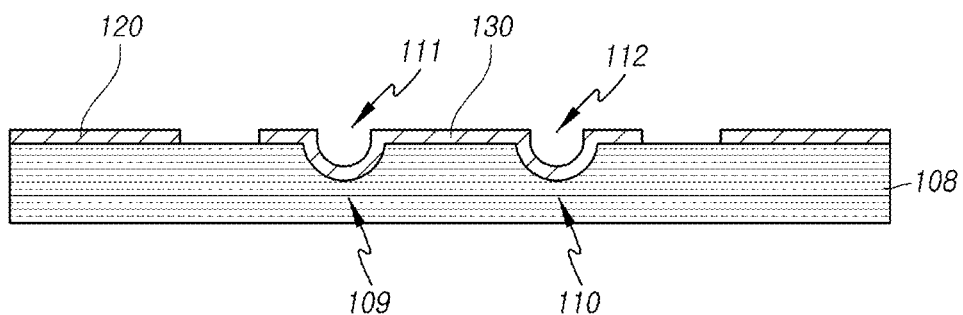

Thereafter, as illustrated in FIG. 8, a first electrode 120 and an auxiliary electrode 130 of an organic electroluminescent device are formed on the overcoat layer 108 having at least two grooves 109 and 110. Here, the first electrode 120 and the auxiliary electrode 130 may be formed by the same process. As such, the first electrode 120 and the auxiliary electrode 130 may be formed simultaneously of a same material.

The first electrode 120 and the auxiliary electrode 130 formed by the same process may be spaced apart from each other. The auxiliary electrode 130 may be formed in regions overlapping at least two grooves 109 and 110 formed in the overcoat layer 108. At this time, the auxiliary electrode 130 may be formed according to morphology of the overcoat layer 108. Therefore, the auxiliary electrode 130 may also have at least two grooves 111 and 112.

Figure 9:
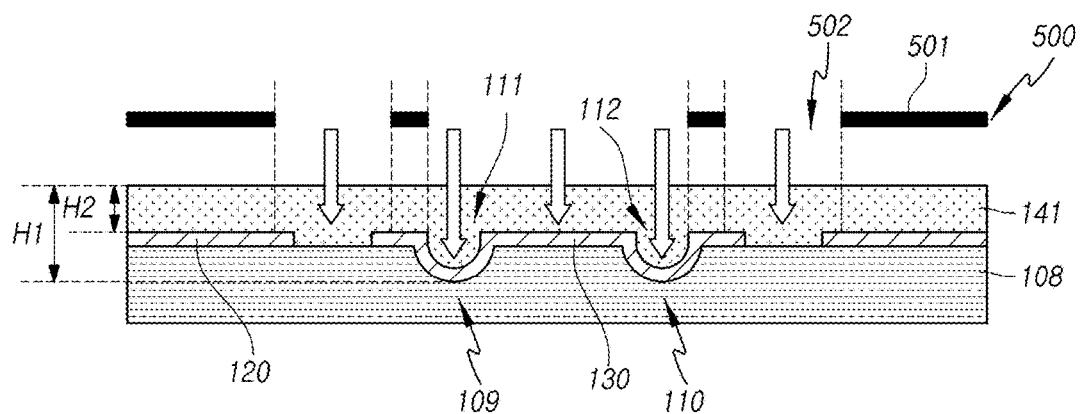
Figure 10:
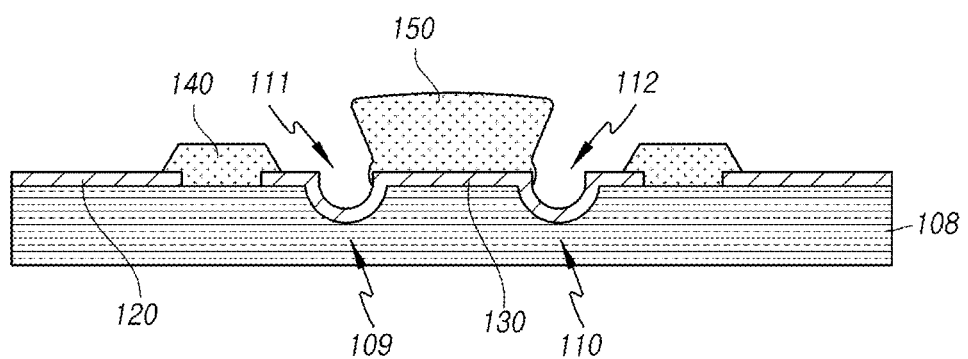

Thereafter, as illustrated in FIGS. 9 and 10, an opaque organic material 141 is applied to the first electrode 120, the auxiliary electrode 130, and the overcoat layer 108. After the opaque organic material 141 is applied to the first electrode 120, the auxiliary electrode 130, and the overcoat layer 108, the opaque organic material 141 is patterned using a mask 500 having a blocking portion 501 and a transmitting portion 502, thereby forming the bank patterns 140 and the barrier rib 150. As such, the bank patterns 140 and the barrier rib 150 may be formed simultaneously of a same material.

The bank patterns 140 may be formed to overlap a portion of the top surface of each of the first electrode 120 and the auxiliary electrode 130 by patterning the opaque organic material 141. A barrier rib 150 may be formed on a flat region disposed between the two grooves 111 and 112 formed in the auxiliary electrode 130. At this time, the bank patterns 140 may have a normal tapered shape and the barrier rib 150 may have a reverse tapered shape.

The opaque organic material 141 applied to the first electrode 120, the auxiliary electrode 130, and the overcoat layer 108 may be negative photoresist that is cured when irradiated with light. That is, a portion of the opaque organic material 141, onto which light is not irradiated by the mask 500, e.g., the opaque organic material 141 applied to a region corresponding to the blocking portion 501 of the mask 500 is removed during developing. The opaque organic material 141 applied to a region corresponding to the transmitting portion 502 of the mask 500 is not removed and remains after developing.

On the other hand, when the opaque organic material 141 disposed to correspond to the transmitting portion 502 of the mask 500 is exposed by an amount of exposure lower than a reference amount of exposure. A portion of the opaque organic material 141 may be removed during developing. Therefore, a dimension of the opaque organic material 141 may be increased, thereby manufacturing the barrier rib 150 having a reverse tapered shape.

Specifically, a height difference may be generated in the opaque organic material 141 through at least two grooves 109 and 110 formed in the overcoat layer 108. In other words, among the opaque organic material 141 applied to the auxiliary electrode 130, a height H1 of the opaque organic material 141 applied to the two grooves 111 and 112 of the auxiliary electrode 130 may be higher than a height H2 of the opaque organic material 141 applied to the flat region disposed between the grooves 111 and 112 of the auxiliary electrode 130.

Therefore, when the opaque organic material 141 is irradiated with light, the height H1 of the opaque organic material 141 applied to the two grooves 111 and 112 formed in the auxiliary electrode 130 is higher than the height H2. Thus, the opaque organic material 141 applied to the two grooves 111 and 112 formed in the auxiliary electrode 130 has a reverse tapered shape by an undercut phenomenon caused by a lack of exposure during developing. That is, due to the two grooves 111 and 112 formed in the auxiliary electrode 130, both sides of the barrier groove 150 may be formed to have a reverse tapered shape by the undercut phenomenon.

A region of the opaque organic material 141, irradiated by an appropriate amount of light, is formed to have a normal tapered shape after developing. Therefore, a region of the opaque organic material 141, irradiated with an appropriate amount of light, remains as the bank patterns 140 having a normal tapered shape, the region of the opaque organic material 141 being disposed to correspond to a portion of the overcoat layer 108, on which a groove is not formed.

At least two grooves 109 and 110 may have a semicircular shape or a semielliptical shape. Therefore, the two grooves 111 and 112 formed in the auxiliary electrode 130 may also have a semicircular shape or a semielliptical shape. As described above, because at least two grooves are formed in each of the overcoat layer 108 and the auxiliary electrode 130, it is possible to form the barrier rib 150 having a reverse tapered shape and the bank patterns 140 having a normal tapered shape at the same time.

However, the shape of the grooves according to the present example embodiment is not limited thereto. It is sufficient as long as a height of the overcoat layer 108 corresponding to the flat region of the auxiliary electrode 130 is higher than a height of the grooves and thus a stepped portion is formed on the overcoat layer 108. Due to the stepped portion described above, a barrier rib may be formed without an additional process. That is, it is possible to form the bank patterns 140 having a normal tapered shape and the barrier rib 150 having a reverse tapered shape at the same time using the stepped portion.

Therefore, an additional process is not necessary to form the barrier rib 150. In addition, unlike the related art, in which it may be difficult to form a reverse tapered shape, because at least two grooves are formed in each of the overcoat layer 108 and the auxiliary electrode 130, the barrier rib 150 may have a reverse tapered shape by using a partial height difference in the opaque organic material 141.

On the other hand, a depth of at least two grooves 109 and 110 formed in the overcoat layer 108 may be in the range of about 1 µm to a height of the overcoat layer 108. A this time, when the depth of at least two grooves 109 and 110 formed in the overcoat layer 108 is less than about 1 µm, the shape of the barrier rib 150 may be more of a normal tapered shape than a reverse tapered shape. In addition, when the depth of at least two grooves 109 and 110 formed in the overcoat layer 108 exceeds the height of the overcoat layer 108, grooves may be formed on other configurations of an organic light-emitting display device, thereby influencing the reliability of a display device.

Figure 11:
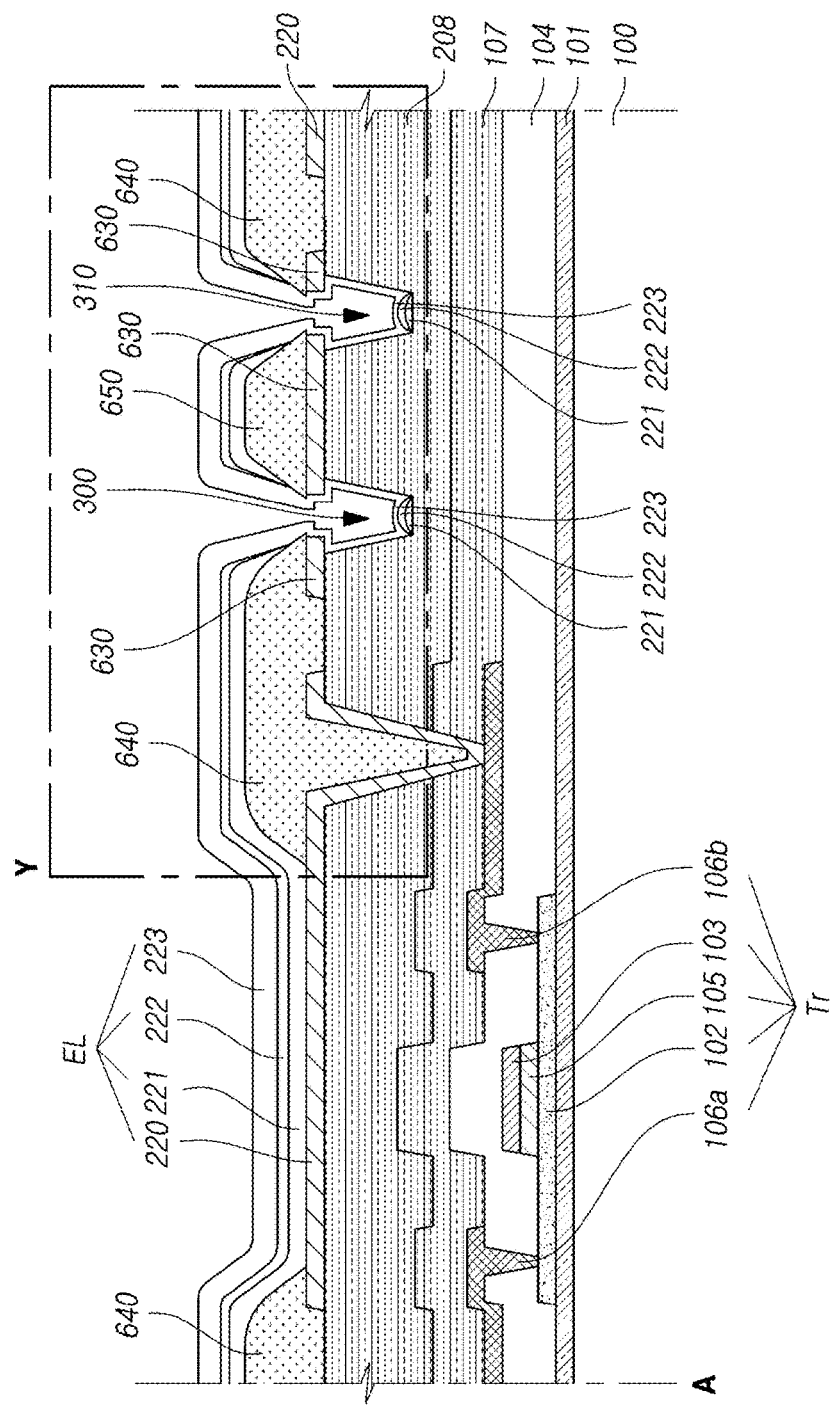
FIG. 11 is a cross-sectional view illustrating an organic light-emitting display device according to a second embodiment.

An organic light-emitting display device according to a second example embodiment will be described with reference to FIG. 11. FIG. 11 is a cross-sectional view illustrating an organic light-emitting display device according to a second embodiment. The organic light-emitting display device according to the second example embodiment may include the same configurations as those of the above-described organic light-emitting display device according to the example embodiment. A repeated description of the above-described example embodiment may be omitted. The same reference numerals denote the same components.

Figure 12:
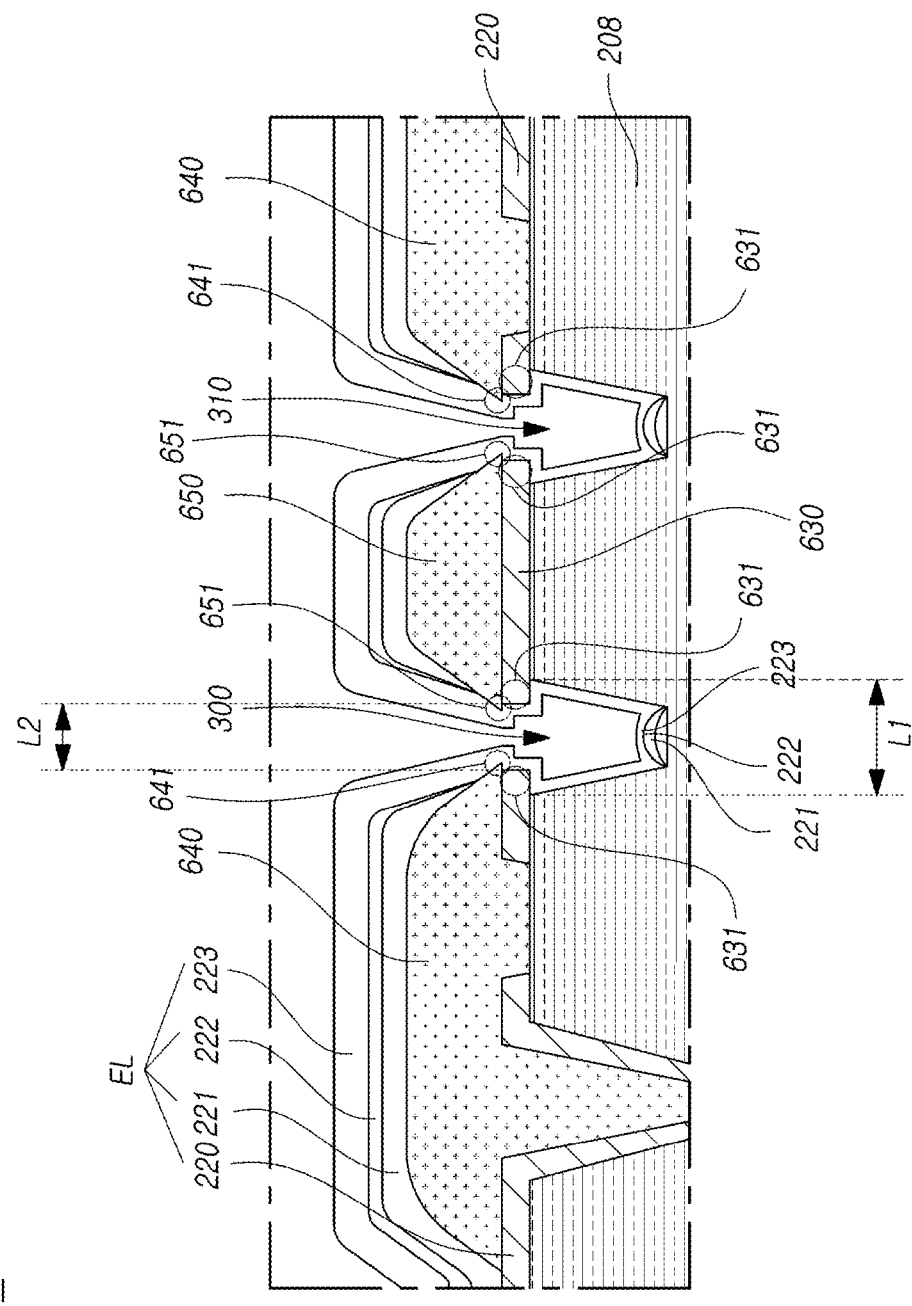
FIG. 12 is an enlarged view of region Y of FIG. 11.

As shown in FIG. 12, the organic light-emitting display device according to the second example embodiment may include an overcoat layer 208 having at least two grooves 300 and 310 in one subpixel. The organic light-emitting display device includes a first electrode 220 of an organic electroluminescent device EL disposed on the overcoat layer 208, an auxiliary electrode 630, and bank patterns 640.

Here, the at least two grooves formed in the overcoat layer 208 may include grooves 300 and 310 except for a contact hole through which the first electrode 220 contacts a drain electrode 106b of a thin film transistor Tr. In addition, the following description will be made with reference to a configuration in which the overcoat layer 108 has two grooves 300 and 310 in one subpixel. However, the organic light-emitting display device according to the present example embodiment may include all configurations in which the overcoat layer 108 has at least two grooves 300 and 310 in one subpixel.

As described above, because the overcoat layer 108 has at least two grooves 300 and 310, the auxiliary electrode 630 of the organic light-emitting display device according to the second example embodiment may also have at least grooves or holes in regions corresponding to at least two grooves 300 and 310 formed in the overcoat layer 208 (the following descriptions will be made with references to a configuration in which holes are formed in an auxiliary electrode). At this time, the auxiliary electrode 630 may be disposed to surround at least two grooves 300 and 310 formed in the overcoat layer 208.

In other words, the auxiliary electrode 630 may be disposed to surround the outsides of at least two grooves 300 and 310 formed in the overcoat layer 208. On a cross section, the auxiliary electrode 630 may be divided into sections by at least two grooves 300 and 310 of the overcoat layer 208. On the other hand, a width (or a size) of the holes formed in the auxiliary electrode 630 may be smaller than a width (or a size) of the grooves 300 and 310 formed in the overcoat layer 208.

That is, the auxiliary electrode 630 may protrude toward the grooves 300 and 310 formed in the overcoat layer 208. In addition, the auxiliary electrode 630 may be disposed to expose side surfaces of the grooves 300 and 310 formed in the overcoat layer 208. That is, the auxiliary electrode 630 may not be disposed in the grooves 300 and 310 formed in the overcoat layer 208.

On the other hand, the bank patterns 640 may be disposed to expose a portion of the top surface of the first electrode 220. In other words, the bank patterns 640 may be disposed to overlap an end of the first electrode 220. The bank patterns 640 disposed to overlap the end of the first electrode 220 as described above may extend to a portion of the top surface of the auxiliary electrode 630. Specifically, the bank patterns 640 may extend to some regions of the holes formed in the auxiliary electrode 630.

That is, the bank patterns 640 may protrude toward the holes formed in the auxiliary electrode 630. In other words, the auxiliary electrode 630 may protrude toward the grooves 300 and 310 formed in the overcoat layer 208, and the bank patterns 640 may protrude toward the holes formed in the auxiliary electrode 630. That is, a region in which the bank patterns 640 and the grooves 300 and 310 formed in the overcoat layer 208 overlap each other may be wider than a region in which the auxiliary electrode 630 and the grooves 300 and 310 formed in the overcoat layer 208 overlap each other.

The bank patterns 640 may be disposed to expose at least one side surface of the holes formed in the auxiliary electrode 630 while protruding toward the holes formed in the auxiliary electrode 630. In addition, the bank patterns 640 may be disposed to expose side surfaces of the grooves 300 and 310 formed in the overcoat layer 208.

A barrier rib 650 may be disposed on the top surface in a region corresponding to a region between the two holes formed in the auxiliary electrode 640. The barrier rib 650 may be disposed to overlap some regions of the holes formed in the auxiliary electrode 630.

That is, the barrier rib 650 may protrude toward the holes formed in the auxiliary electrode 630. In other words, the auxiliary electrode 630 may protrude toward the grooves 300 and 310 formed in the overcoat layer 208, and the barrier rib 650 may protrude toward the holes formed in the auxiliary electrode 630. That is, a region in which the barrier rib 650 and the grooves 300 and 310 of the overcoat layer 208 overlap each other may be wider than a region in which the auxiliary electrode 630 and the grooves 300 and 310 of the overcoat layer 208 overlap each other.

The barrier rib 650 may be disposed to expose at least one side surface of the holes formed in the auxiliary electrode 630 while protruding toward the holes formed in the auxiliary electrode 630. In addition, the barrier rib 650 may be disposed to expose side surfaces of the grooves 300 and 310 formed in the overcoat layer 208. In other words, the barrier rib 650 may not be disposed in the grooves 300 and 310 formed in the overcoat layer 208.

On the other hand, the barrier rib 650 disposed on the auxiliary electrode 630 may be disposed on the same layer as and made of the same material as the bank patterns 640. For example, the bank patterns 640 and the barrier rib 650 may be made of an opaque organic material or a transparent organic material. That is, it is sufficient as long as the bank patterns 640 and the barrier rib 650 according to a second example embodiment are made of the same material. In addition, all the bank patterns 640 and the barrier rib 650 according to the second example embodiment may have a normal tapered shape.

As described above, because the bank patterns 640 and the barrier rib 650 according to the second example embodiment are disposed on the same layer, made of the same material, and have the same normal tapered shape, the bank patterns 640 and the barrier rib 650 may be formed by the same process. Therefore, additional processes may not be necessary to form the barrier rib 650, thereby simplifying a process.

Meanwhile, an organic light-emitting layer 221, a second electrode 222, and an electrode layer 223 of an organic electroluminescent device EL are disposed on a substrate 100 on which the bank patterns 640 and the barrier rib 650 are formed. Here, at the time of forming the organic light-emitting layer 221, a protrusion of the barrier rib 650 may block a material of the organic light-emitting layer 221 to expose side surfaces of the grooves 300 and 310 formed in the overcoat layer 208. In addition, due to the protrusion of the barrier rib 650, the organic light-emitting layer 221 may be disposed to expose side surfaces and the bottom surface of the auxiliary electrode 630 overlapping the grooves 300 and 310 of the overcoat layer 208.

In addition, on a cross section, the grooves 300 and 310 according to the second example embodiment may have a polygonal shape. For example, the grooves 300 and 310 may have a tetragonal shape. As described above, because the grooves 300 and 310 have a polygonal shape, a gradient of side surfaces of the grooves 300 and 310 is steep. Accordingly, it may be more difficult for the material of the organic light-emitting layer 221 to penetrate into regions corresponding to the side surfaces of grooves 300 and 310.

The second electrode 222 is disposed on the organic light-emitting layer 221. However, because the second electrode 222 should be thinly formed, the second electrode 222 is blocked by the protrusion of the barrier rib 650 and does not sufficiently penetrate a region in which the auxiliary electrode 630 is exposed. Accordingly, the second electrode 222 may be disposed to expose side surfaces and the bottom surface of the auxiliary electrode 630 (a detailed review will be conducted through a description with respect to FIG. 12). At this time, the electrode layer 223 penetrating to the side surfaces and the bottom surface of the auxiliary electrode 630 through the protrusion of the barrier rib 650 is disposed on the second electrode 222.

On the other hand, the second electrode 222 may be made of a metal alloy, and the electrode layer 223 may be made of a transparent conductive material. That is, when light emitted from the organic electroluminescent device EL travels upwardly, a loss of light is increased as the second electrode 222 becomes thicker. Because the electrode layer 223 is made of the transparent conductive layer, even when the light emitted from the organic electroluminescent device EL travels upwardly, the loss of the light is small.

Therefore, the second electrode 222 may be thinly formed and the electrode layer 223 made of the transparent conductive material may be disposed to contact the second electrode 222, and thus, the second electrode 222 and the electrode layer 223 may be electrically connected to each other. In addition, because the auxiliary electrode 630 and the electrode layer 223 are disposed to contact each other, the second electrode 222 and the auxiliary electrode 630 may be electrically connected to each other.

In other words, the electrode layer 223 may contact side surfaces of the holes formed in the auxiliary electrode 630. Specifically, because the electrode layer 223 is formed by a deposition method or a coating method having no constant directionality, the electrode layer 223 may be formed to contact the barrier rib 650 and the side surfaces of the holes formed in the auxiliary electrode 630.

As a result, the electrode layer 230 and the auxiliary electrode 630 contact each other, thereby preventing a brightness difference between a peripheral portion and a central portion of a panel from being caused by a voltage drop due to the second electrode 222.

Although the electrode layer 223 is illustrated in FIG. 11 as being further disposed on the second electrode 222, the organic light-emitting display device according to the present example embodiment is not limited thereto and may not include the electrode layer 223. At this time, the second electrode 222 may be made of a transparent conductive material.

The configurations will be described in more detail with reference to FIG. 12. FIG. 12 is an enlarged view of region Y of FIG. 11. The following example embodiment described later may include the same configurations as those of the above-described example embodiment. A repeated description of the above-described example embodiment may be omitted. The same reference numerals denote the same components.

With reference to FIG. 12, in the organic light-emitting display device according to the second embodiment, the overcoat layer 208 has at least two grooves 300 and 310 in one subpixel. At this time, the auxiliary electrode 630 is disposed to surround at least two grooves 300 and 310. The auxiliary electrode 630 may overlap some regions of the two grooves 300 and 310 formed in the overcoat layer 208. That is, the auxiliary electrode 630 may have protrusions 631 in regions overlapping the grooves 300 and 310 formed in the overcoat layer 208. Here, the protrusions 631 of the auxiliary electrode 630 may cover some regions of the grooves 300 and 310 formed in the overcoat layer 208. In other words, the auxiliary electrode 630 may have the holes having a width L2 smaller than a width L1 of the grooves 300 and 310 formed in the overcoat layer 208 in the regions corresponding to the grooves 300 and 310 formed in the overcoat layer 208.

In addition, the bank patterns 640 and the barrier rib 650 may be disposed on a portion of the top surface of the auxiliary electrode 630. At this time, the bank patterns 640 and the barrier rib 650 may overlap some regions of the holes formed in the auxiliary electrode 630. That is, the bank patterns 640 and the barrier rib 650 may have protrusions 641 and 651 in regions overlapping the holes formed in the auxiliary electrode 630, respectively. At this time, a width of the protrusion 641 of the bank patterns 640 and the protrusion 651 of the barrier rib 650 may be greater than a width of the protrusion 631 of the auxiliary electrode 630. The protrusion 641 of the bank patterns 640 and the protrusion 651 of the barrier rib 650 may cover some regions of the holes formed in the auxiliary electrode 630.

As described above, because the auxiliary electrode 630 has the protrusions 631 overlapping the grooves 300 and 310 formed in the overcoat layer 208 and the bank patterns 640 and the barrier rib 650 disposed on the auxiliary electrode 630 respectively have the protrusions 641 and 651 overlapping the holes formed in the auxiliary electrode 630, at least one stepped portion may be formed on an outer portion of each of the grooves 300 and 310.

Specifically, a stepped portion caused by the protrusion 631 of the auxiliary electrode 630 and the protrusion 641 of the bank patterns 640 or a stepped portion caused by the protrusion 631 of the auxiliary electrode 630 and the protrusion 651 of the barrier rib 650 may be formed on the outer portion of each of the grooves 300 and 310. The stepped portion formed on the outer portion of the grooves 300 and 310 may prevent a contact between the auxiliary electrode 630 and the organic light-emitting layer 221.

The organic light-emitting layer 221 is disposed on the overcoat layer 208, the first electrode 220, the auxiliary electrode 630, the bank patterns 640, and the barrier rib 650. Here, the organic light-emitting layer 221 may be formed by a deposition method or a coating method having linearity. For example, the organic light-emitting layer 221 may be formed by an evaporation method.

When the organic light-emitting layer 221 is formed though the method as described above, a material of the organic light-emitting layer 221 may be blocked by the protrusion 641 of the bank patterns 640 and the protrusion 651 of the barrier rib 650. Thus, the organic light-emitting layer 221 may only be formed on bottoms of the grooves 300 and 310 formed in the overcoat layer 208. That is, the organic light-emitting layer 221 may be disposed to expose side surfaces of the grooves 300 and 310 formed in the overcoat layer 208 and side surfaces of the protrusion 631 of the auxiliary electrode 630. That is, the organic light-emitting layer 221 and the auxiliary electrode 630 may not contact each other.

As described above, the organic light-emitting layer 221 may be disposed to expose the side surfaces and the bottom surface of the protrusion 631 of the auxiliary electrode 630, thereby facilitating an electrical contact between the auxiliary electrode 630 and the second electrode 222.

In addition, the second electrode 222 of the organic electroluminescent device EL is disposed on the organic light-emitting layer 221. The second electrode 222 of the organic electroluminescent device EL may be formed by a deposition method or a coating method having no constant directionality. For example, the second electrode 222 may be formed by a sputtering method. Because the sputtering method has excellent step coverage, the second electrode 122 may be easily formed even with respect to a structure having a stepped portion.

On the other hand, because a loss of light emitted from the organic electroluminescent device EL may be caused when the second electrode 222 is made of a metal material or a metal alloy having low transparency, the second electrode 222 may be thinly formed. That is, the second electrode 222 should be thin enough to not reflect light and to transmit light. However, because the second electrode 222 is thinly formed, the second electrode 222 may not be formed on an outside portion of the grooves 300 and 310 formed in the overcoat layer 208.

Specifically, because the second electrode 222 is easily formed by a method of easily forming the second electrode 222 even with respect to a structure having a stepped portion but should be thinly formed, a material of the second electrode 222 is insufficient to allow the material to penetrate a stepped portion formed on the outside portion of the grooves 300 and 310 formed in the overcoat layer 208 and to be deposited.

Therefore, as illustrated in FIG. 12, the second electrode 222 may be disposed on the organic light-emitting layer 221. Specifically, the second electrode 222 may not be disposed on side surfaces of the grooves 300 and 310 formed in the overcoat layer 208, side surfaces of the protrusion 631 of the auxiliary electrode 630, the bottom surface of the protrusion 641 of the bank patterns 640, and the bottom surface of the protrusion 651 of the barrier rib 650.

As described above, the second electrode 222 and the auxiliary electrode 630 may not directly contact each other. Therefore, for electrical contact between the second electrode 222 and the auxiliary electrode 630 to be formed, the electrode layer 223 is disposed to contact the side surfaces of the protrusion 631 of the auxiliary electrode 630.

The electrode layer 223 may also be formed in the same manner as in the second electrode 222. In addition, because the electrode layer 223 is made of a transparent material to prevent a loss of light emitted from the organic electroluminescent device EL, the electrode layer 223 may be formed to be sufficiently thick. Therefore, a material of the electrode layer 223 may sufficiently penetrate the stepped portion formed on the outside portion of the grooves 300 and 310 formed in the overcoat layer 208.

That is, the electrode layer 223 may be disposed on the second electrode 222 and may also be disposed on the side surfaces of the grooves 300 and 310 formed in the overcoat layer 208, the side surfaces and the bottom surface of the protrusion 631 of the auxiliary electrode 630, the bottom surface of the protrusion 641 of the bank patterns 640, and the bottom surface of the protrusion 651 of the barrier rib 650. Therefore, the electrode layer 233 may contact the side surfaces and the bottom surface of the protrusion 631 of the auxiliary electrode 630.

That is, the second electrode 222 and the electrode layer 223 are disposed to contact each other and the electrode layer 223 and the auxiliary electrode 630 are disposed to contact each other, thereby allowing the second electrode 222 and the auxiliary electrode to electrically contact each other.

A method for manufacturing the organic light-emitting display device according to the second example embodiment will be described with reference to FIGS. 13 to 16. FIGS. 13 to 16 are views illustrating a method for manufacturing the organic light-emitting display device according to the second example embodiment.

Figure 13:
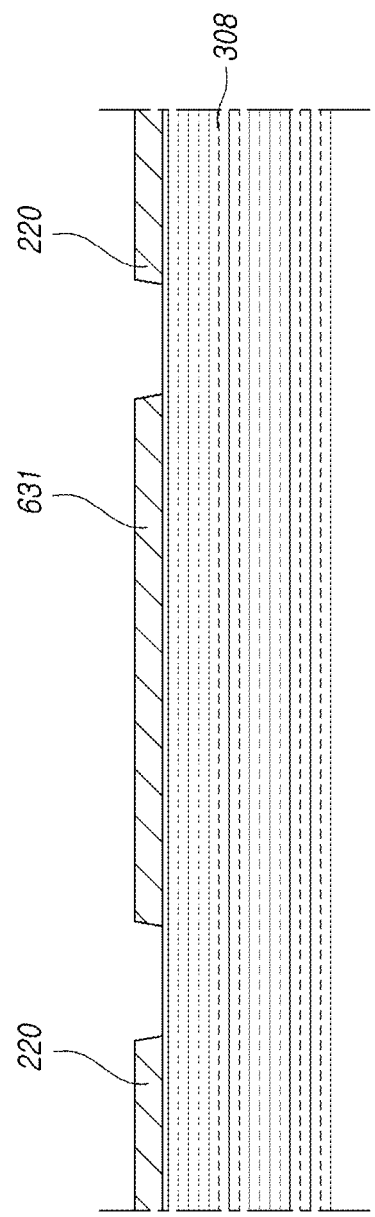
FIGS. 13 to 16 are views illustrating a method for manufacturing the organic light-emitting display device according to the second example embodiment.

First, with reference to FIG. 13, a first electrode 220 and auxiliary electrode patterns 630 are formed on an overcoat layer 308. At this time, the first electrode 220 and the auxiliary electrode patterns 631 may be made of the same material through the same process. Thereafter, a bank pattern material is applied to the first electrode 220 and the auxiliary electrode patterns 631. The bank pattern material may be an opaque organic material or a transparent organic material.

Figure 14:
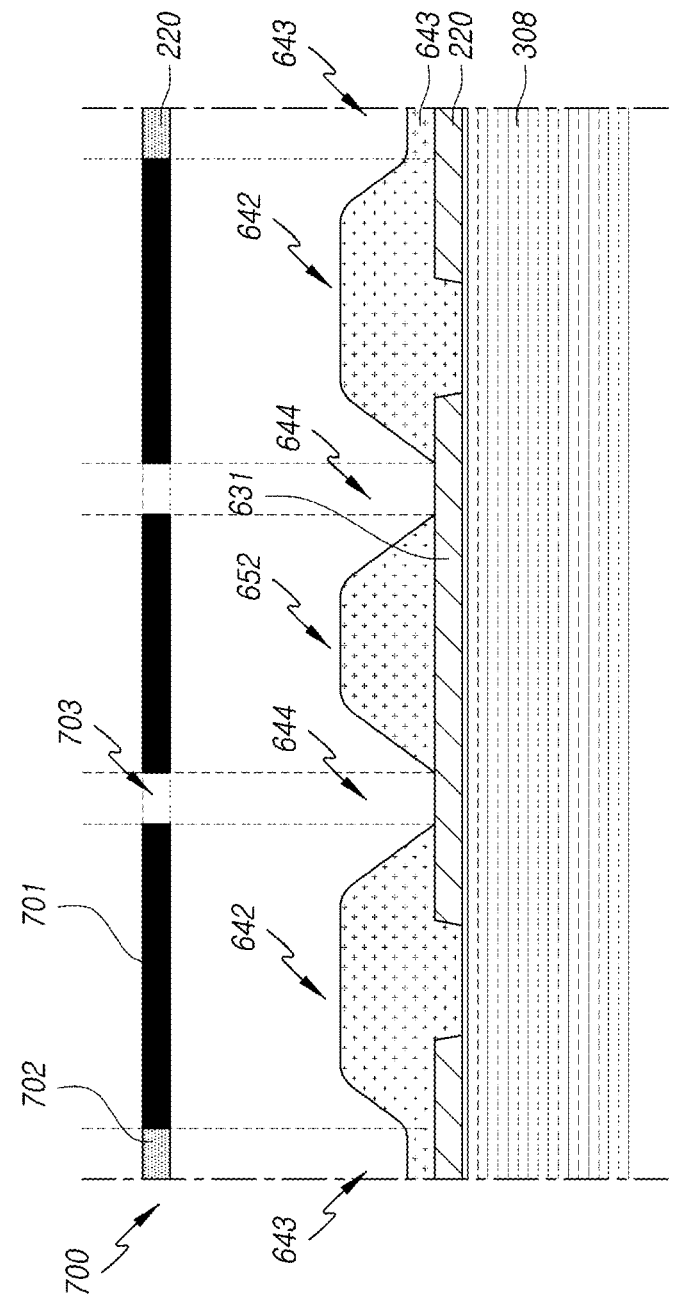

As illustrated in FIG. 14, the bank pattern material is allowed to have different heights according to regions by using a halftone mask 700. Specifically, a blocking portion 701 of the halftone mask 700 corresponds to regions corresponding to a bank region 641 in which bank patterns are formed later and a barrier rib region 652 in which a barrier rib is formed later. A semi-transmitting portion 702 of the halftone mask 700 corresponds to an upper portion of the first electrode 220 that will subsequently define an emission area. A transmitting portion 703 of the halftone mask 700 corresponds to a region corresponding to a region 644 in which grooves of an auxiliary electrode will be subsequently formed.

Thereafter, when a developing process is performed, the largest amount of the bank pattern material remains in the bank region 642 and the barrier rib region 652. A bank pattern material thinner than the bank pattern material remaining in the bank region 642 and the barrier rib region 652 remains on the upper portion of the first electrode 220 that will define the emission area 643. A bank pattern material may be removed from the region corresponding to the region 644 in which the grooves of the auxiliary electrode will be subsequently formed. The auxiliary electrode patterns 631 are etched by using the bank pattern material as a mask.

Figure 15:
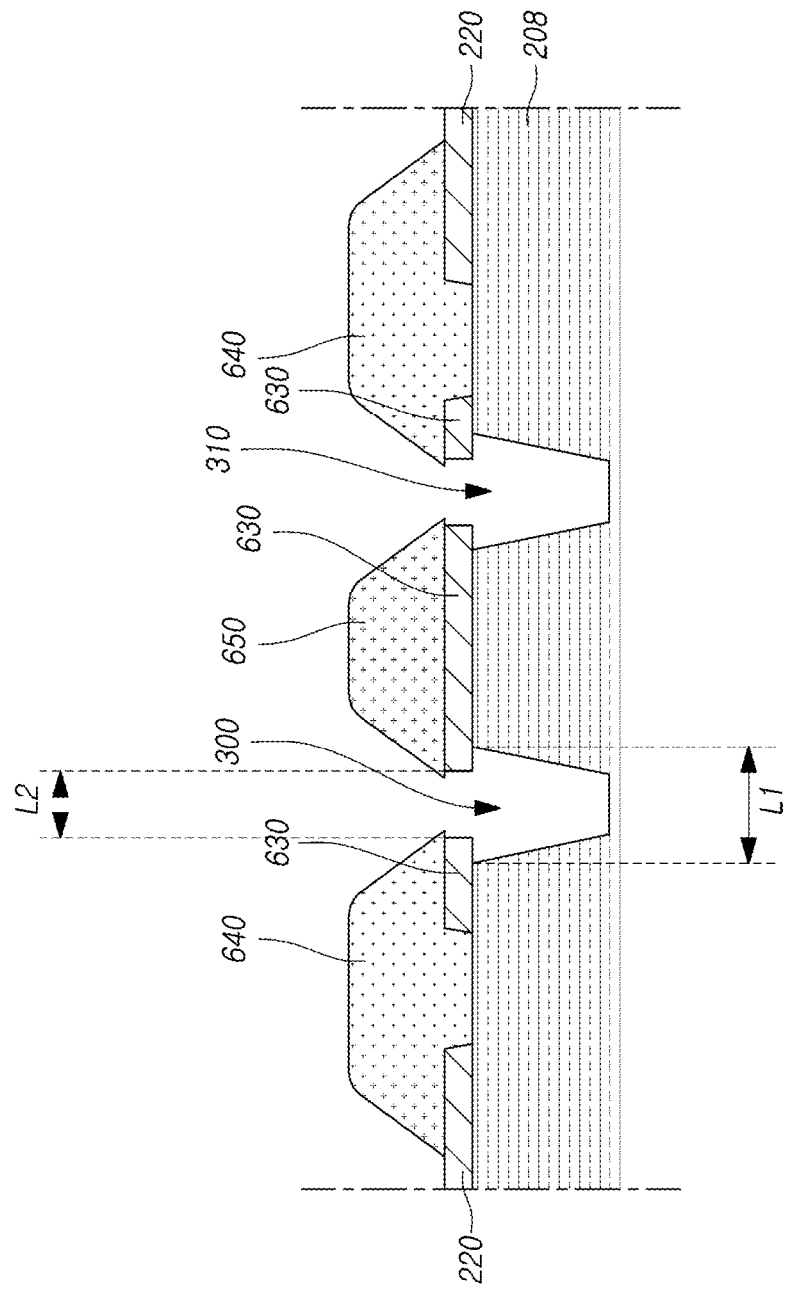

After the auxiliary electrode patterns 631 are etched, as illustrated in FIG. 15, two holes may be formed in an auxiliary electrode 630. Thereafter, to expose bank patterns 640, a barrier rib 650, and the first electrode 220, the bank pattern material is partially ashed. The upper portion of the first electrode 220 may be exposed through an ashing process. In other words, the upper portion of the first electrode 220 may be exposed in a region of FIG. 14, which will subsequently define the emission area 643. In addition, due to the ashing process, a height of the bank patterns 640 and the barrier rib 650 may be lower than a height of the bank pattern material disposed in the bank region 642 and the barrier rib region 652 of FIG. 14.

On the other hand, as illustrated in FIG. 15, all of the bank patterns 640 and the barrier rib 650 may be formed in a normal tapered shape and be formed by the same process by using the same mask. Therefore, a process of forming the bank patterns 640 and the barrier rib 650 may be simplified.

In addition, grooves 300 and 310 are formed in an overcoat layer 208 by using the auxiliary electrode 630 as a mask. Here, a width L1 of the grooves 300 and 310 formed in the overcoat layer 208 may be wider that a width L2 of the holes formed in the auxiliary electrode 630.

Figure 16:
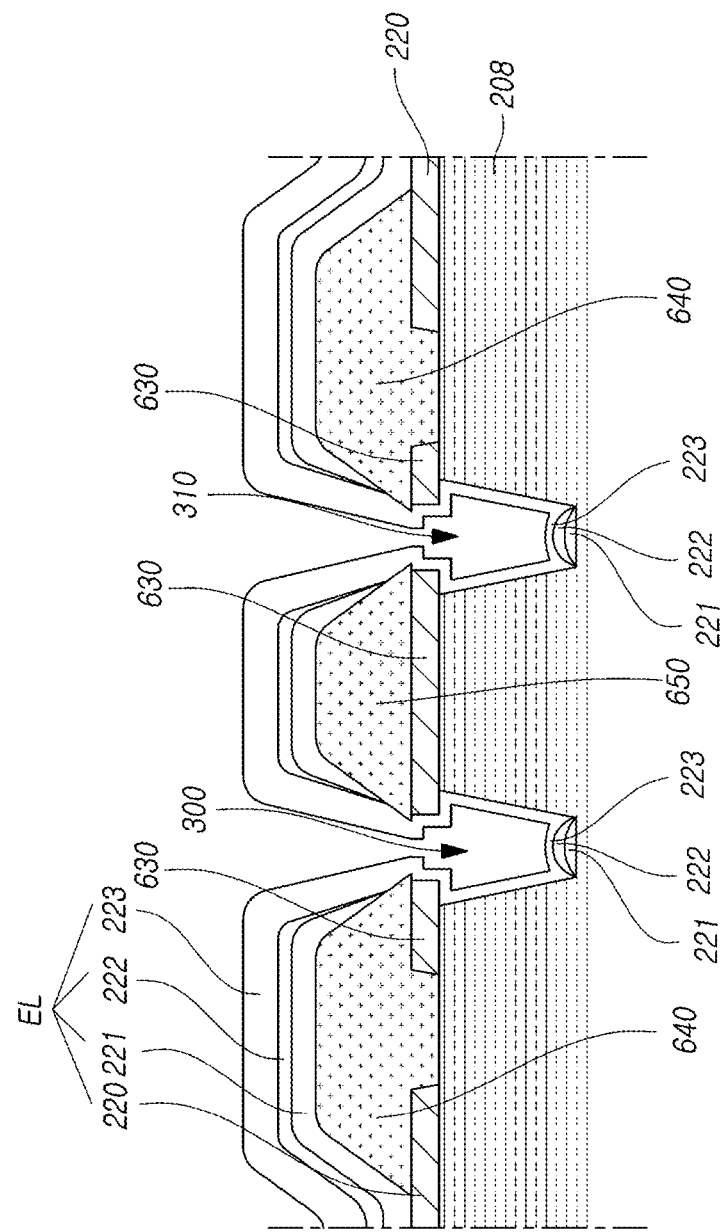

Thereafter, as illustrated in FIG. 16, an organic light-emitting layer 221 is formed. At this time, the organic light-emitting layer 221 may be formed by a deposition method or a coating method having linearity. Therefore, a material of the organic light-emitting layer 221 may be blocked by a protrusion of the bank patterns 640 and a protrusion of the barrier rib 650, so that the organic light-emitting layer 221 may only be formed on bottom portions of the grooves 300 and 310 formed in the overcoat layer 208.

After the organic light-emitting layer 221 is formed, a second electrode 222 and an electrode layer 223 are formed. At this time, the second electrode 222 and the electrode layer 223 may be formed by a deposition method or a coating method having no constant directionality. However, because the second electrode 222 is thinly formed, the second electrode 222 and the auxiliary electrode 630 may not contact each other.

Meanwhile, because the electrode layer 223 is formed thicker than the second electrode 222, a material of the electrode layer 223 may penetrate into a stepped portion formed an outside portion of the grooves 300 and 310 formed in the overcoat layer 208. Therefore, the electrode layer 223 may be formed even on the bottom surface of the protrusion of the bank patterns 640, the bottom surface of the protrusion of the barrier rib 650, side surfaces and the bottom surface of the protrusion of the auxiliary electrode 630, and side surfaces of the grooves 300 and 310.

As described above, because only one mask is used in forming the grooves 300 and 310 formed in the overcoat layer 208, the first electrode 220, the auxiliary electrode 630, the bank patterns 640, the barrier rib 650, the second electrode 222, and the electrode layer 223, manufacturing costs of the organic light-emitting display device according to the second example embodiment can be reduced. In particular, the bank patterns 640 and the barrier rib 650 are formed by the same process, thereby simplifying the manufacturing process.

Figure 17:
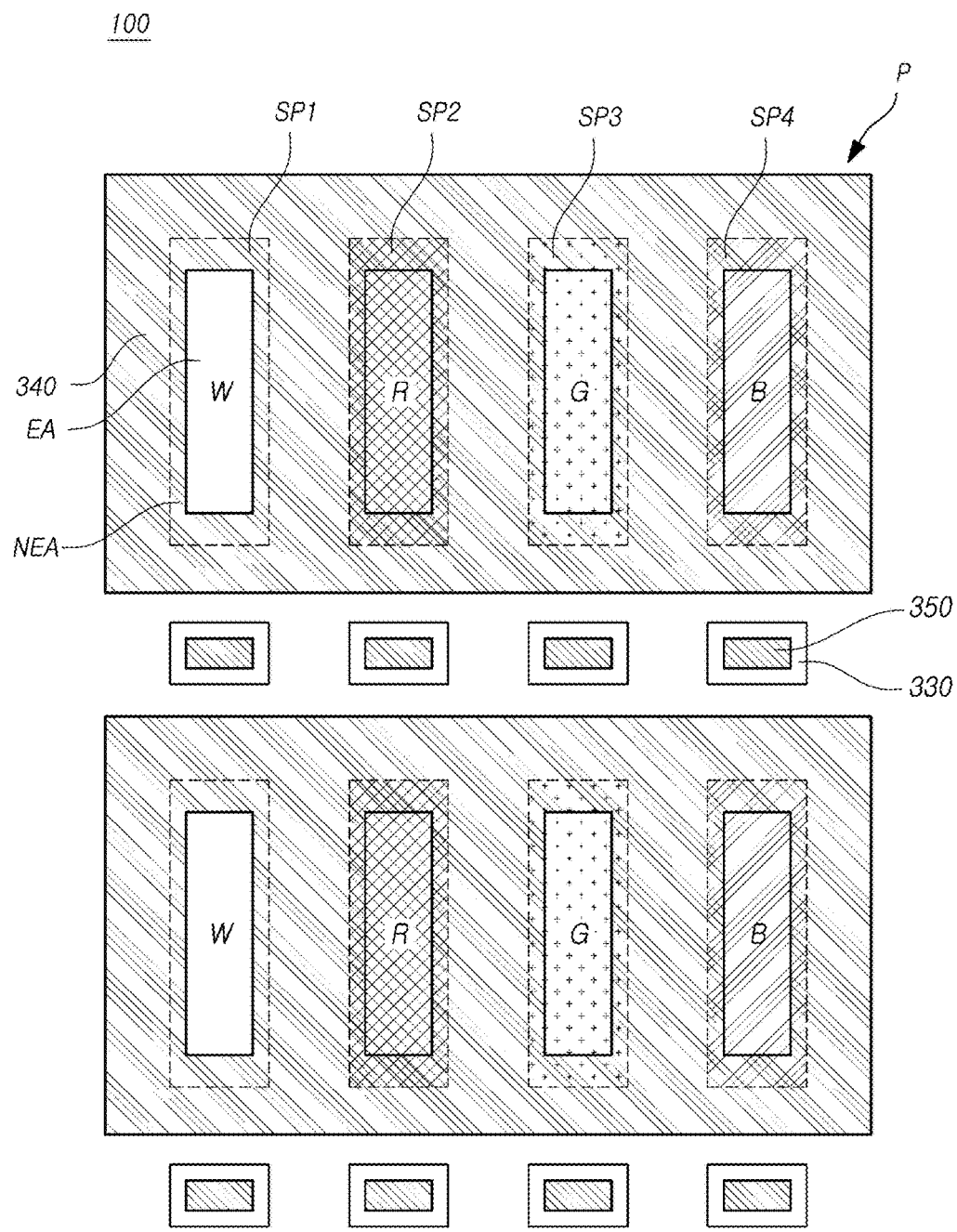
FIG. 17 is a plan view illustrating a placement relationship between a subpixel and an auxiliary electrode according to an example embodiment.

In addition, an auxiliary electrode and a barrier rib may be disposed at various positions, as will be described with reference to FIGS. 17 to 19. FIG. 17 is a plan view illustrating a placement relationship between a subpixel and an auxiliary electrode according to an example embodiment. In FIG. 17, a plurality of pixel regions P is disposed on a substrate 100. A plurality of subpixels is disposed on each of the pixel regions P.

Specifically, each of the pixel regions P may include a first subpixel SP1, a second subpixel SP2, a third subpixel SP3, and a fourth subpixel SP4. Although each of the pixel regions P includes four subpixels in a view, the present example embodiment is not limited thereto. One pixel region P may include two or three subpixels.

Here, the first to fourth subpixels SP1 to SP4 may be defined as an emission area EA and a non-emission area NEA by bank patterns 340. That is, a region opened by the bank patterns 340 may be the emission area EA, and a region in which the bank patterns 340 are disposed may be the non-emission area NEA. At this time, the non-emission area NEA may include a region in which an auxiliary electrode 330 is disposed.

The auxiliary electrode 330 may be disposed on a lower portion of each of the first to fourth subpixels SP1 to SP4. That is, one auxiliary electrode 330 may be disposed on one subpixel. The auxiliary electrode 330 may be disposed in parallel to a gate line (not shown) or a data line (not shown).

On the other hand, a barrier rib 350 may be disposed on a portion of the top surface of the auxiliary electrode 330. Here, the bank patterns 340 and the barrier rib 350 may be disposed on the same layer and made of the same material. The bank patterns 340 may be formed in a normal tapered shape and the barrier rib 350 may be formed in a reverse tapered shape.

In addition, the auxiliary electrode 330 is illustrated in a view as being disposed on the lower portion of each of the first to fourth subpixels SP1 to SP4, but the present example embodiment is not limited thereto. The auxiliary electrode 330 may be disposed on an upper portion and side portions of each of the first to fourth subpixels SP1 to SP4. That is, it is sufficient as long as the present example embodiment has a configuration in which one auxiliary electrode 330 is disposed in one subpixel. As described above, the auxiliary electrodes 340 are respectively disposed in the subpixels, thereby adjusting a voltage difference of an organic light-emitting display device for every subpixel.

Figure 18:
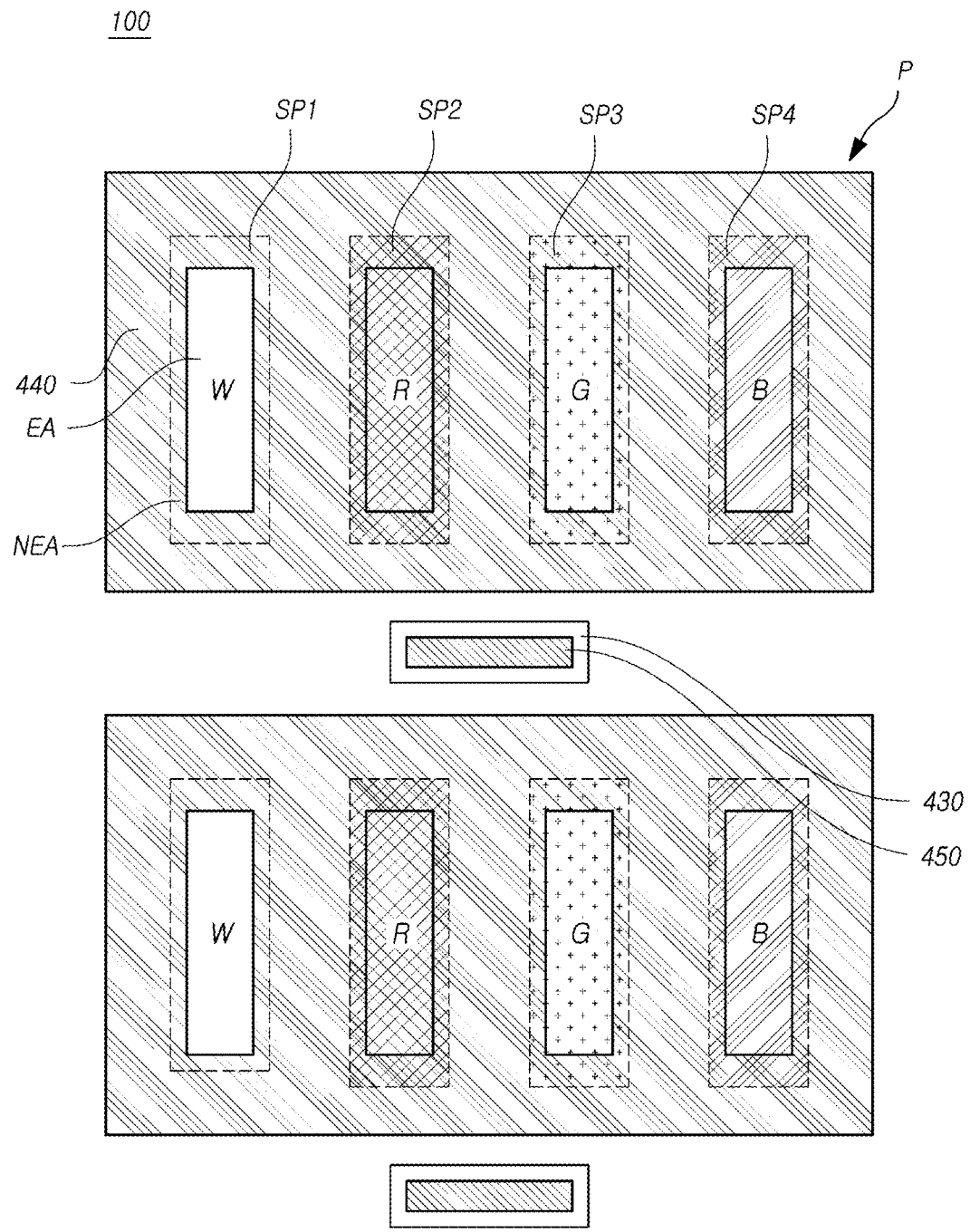
FIG. 18 is a plan view illustrating a placement relationship between a subpixel and an auxiliary electrode according to another example embodiment.

FIG. 18 is a plan view illustrating a placement relationship between a subpixel and an auxiliary electrode according to another example embodiment. An organic light-emitting display device according to another example embodiment may include the same configurations as those of the above-described organic light-emitting display device according to the example embodiment. A repeated description of the above-described example embodiment may be omitted. The same reference numerals denote the same components. In FIG. 18, a plurality of pixel regions P respectively including a plurality of subpixels SP1 to SP4 are disposed on a substrate 100.

An auxiliary electrode 430 may be disposed on a lower portion of each of the pixel regions P. That is, one auxiliary electrode 430 may be disposed in one pixel region P. The auxiliary electrode 430 may be disposed in parallel to a gate line (not shown) or a data line (not shown).

A barrier rib 450 disposed on the same layer as and made of the same material as bank patterns 440 may be disposed on the auxiliary electrode 430. Here, the bank patterns 440 may be formed in a normal tapered shape and the barrier rib 450 may be formed in a reverse tapered shape.

In addition, the auxiliary electrode 430 is illustrated in a view as being disposed on the lower portion of each of the pixel regions P, but the present example embodiment is not limited thereto. The auxiliary electrode 430 may be disposed on an upper portion and side portions of each of the pixel regions P. That is, it is sufficient as long as the present example embodiment has a configuration in which one auxiliary electrode 430 is disposed in one pixel region P. As described above, the auxiliary electrodes 340 are respectively disposed in the pixel regions P, thereby adjusting a voltage difference of an organic light-emitting display device for each pixel region P.

Figure 19:
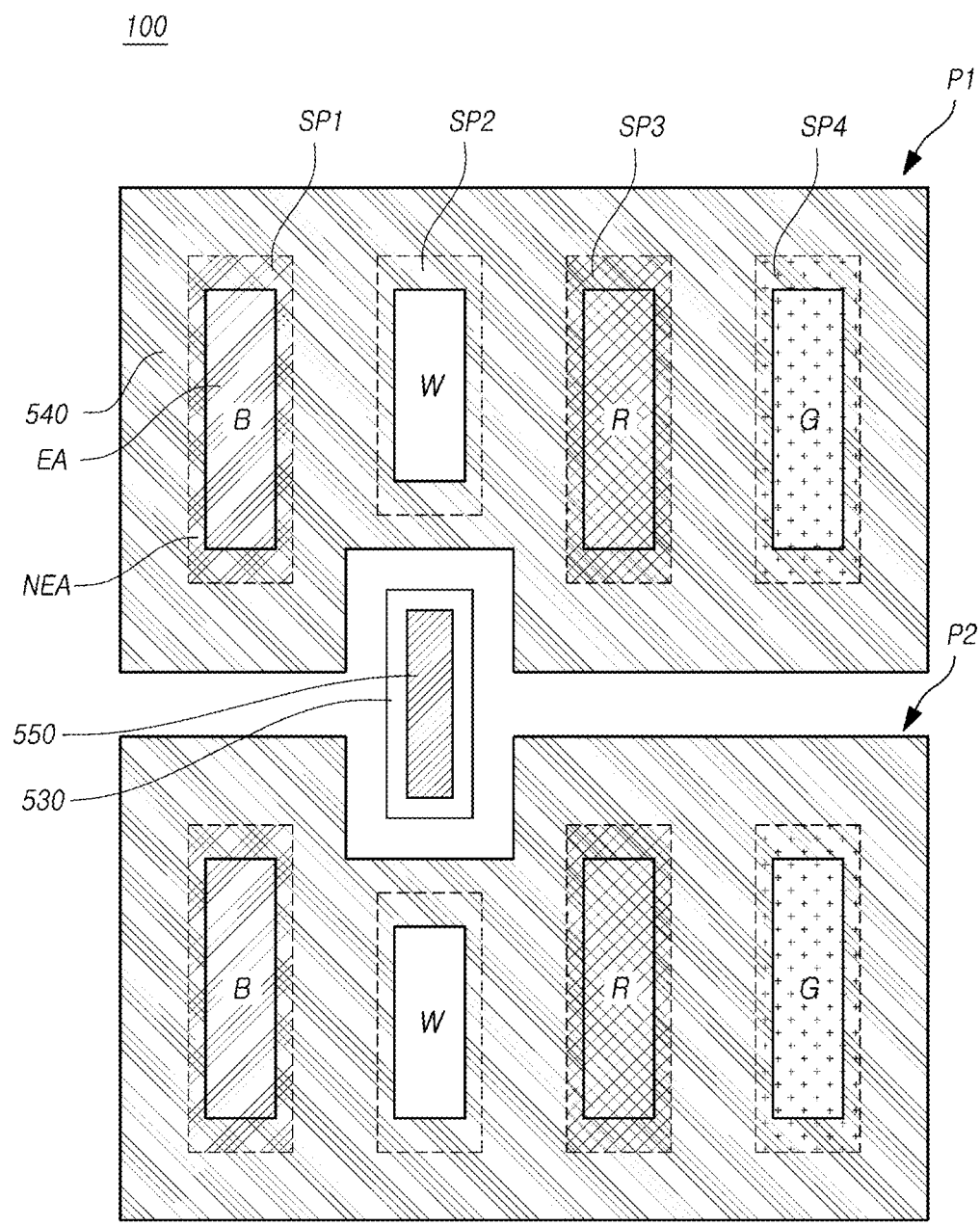
FIG. 19 is a plan view illustrating a placement relationship between a subpixel and an auxiliary electrode according to another example embodiment.

FIG. 19 is a plan view illustrating a placement relationship between a subpixel and an auxiliary electrode according to another example embodiment. An organic light-emitting display device according to another example embodiment may include the same configurations as those of the above-described organic light-emitting display device according to the example embodiment. A repeated description of the above-described example embodiment may be omitted. The same reference numerals denote the same components.

As shown in FIG. 19, a first pixel region P1 and a second pixel region P2 respectively including a plurality of subpixels SP2 to SP4 are disposed on a substrate 100. Here, the first pixel region P1 and the second pixel region P2 are disposed adjacently to each other. For example, the first pixel region P1 may be disposed on an upper portion of the second pixel region P2.

Here, an auxiliary electrode 530 may be disposed between the first pixel region P1 and the second pixel region P2. Specifically, the auxiliary electrode 530 may be disposed between one subpixel disposed in the first pixel region P1 and one subpixel of the second pixel region P2, disposed to correspond to the one subpixel.

For example, the auxiliary electrode 530 may be disposed between a second subpixel SP2 disposed in the first pixel region P1 and a second subpixel SP2 disposed in the second pixel region P2. Here, the second subpixel SP2 may be a white subpixel W.

Although the auxiliary electrode 530 is illustrated in a view as being disposed between the white subpixel W of the first pixel region P1 and the white subpixel W of the second pixel region P2, the present example embodiment is not limited thereto. The auxiliary electrode 530 may be disposed between a red subpixel R of the first pixel region P1 and a red subpixel R of the second pixel region P2, between a green subpixel G of the first pixel region P1 and a green subpixel G of the second pixel region P2, or between a blue subpixel B of the first pixel region P1 and a blue subpixel B of the second pixel region P2.

A barrier rib 550 disposed on the same layer as and made of the same material as bank patterns 540 may be disposed on the auxiliary electrode 530. Here, the bank patterns 540 may be formed in a normal tapered shape and the barrier rib 550 may be formed in a reverse tapered shape.

Although the present example embodiment provides a configuration in which one auxiliary electrode 530 disposed between two pixel regions, the present disclosure is not limited thereto. A plurality of pixel regions may include one auxiliary electrode 530. As described above, the plurality of pixel regions may include one auxiliary electrode 530, thereby adjusting a voltage difference of an organic light-emitting display device for each of a plurality of pixel regions.

According to an organic light-emitting display device and a method for manufacturing the same, bank patterns and a barrier rib can be formed though the same process, thereby simplifying a process. In addition, according to the organic light-emitting display device and the method for manufacturing the same, a cathode and an auxiliary electrode can easily contact each other, thereby preventing a voltage drop from being caused by a resistance of the cathode.

The features, structures, and effects described in the present disclosure are included in at least one embodiment but are not necessarily limited to a particular embodiment. A person skilled in the art can apply the features, structures, and effects illustrated in the particular embodiment to another embodiment by combining or modifying such features, structures, and effects. It should be understood that all such combinations and modifications are included within the scope of the present disclosure.

It will be apparent to those skilled in the art that various modifications and variations can be made in the organic light-emitting display device and the method of fabricating the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A method of fabricating an organic light-emitting display device, the method comprising:
   forming an insulating layer on a substrate, the substrate defining an emission area and a non-emission area, and the insulating layer including at least two dented portions at the non-emission area;
   forming a first electrode on the insulating layer at the emission area;
   forming an auxiliary electrode on the insulating layer at the non-emission area and corresponding to the at least two dented portions;
   forming a bank pattern on the first electrode and the auxiliary electrode;
   forming an organic light-emitting layer on the first electrode; and
   forming a second electrode on the organic light-emitting layer and the auxiliary electrode and electrically connected to the auxiliary electrode.

2. The method according to claim 1, further comprising a step of forming a barrier on the auxiliary electrode.

3. The method according to claim 2, wherein the barrier is disposed between the at least two dented portions.

4. The method according to claim 2, wherein the barrier is formed of a same material as the bank pattern.

5. The method according to claim 4, wherein the bank pattern and the barrier include an opaque organic material.

6. The method according to claim 2, wherein the bank pattern has a normal tapered shape, and the barrier has a reverse tapered shape.

7. The method according to claim 6, wherein the auxiliary electrode has a continuous top surface along a top surface of the insulating layer including the at least two dented portions.

8. The method according to claim 7, wherein the auxiliary electrode includes at least two concave portions corresponding to the at least two dented portions.

9. The method according to claim 8, wherein the auxiliary electrode further includes a flat portion between the at least two concave portions.

10. The method according to claim 9, wherein the barrier is disposed on the flat portion.

11. The method according to claim 2, wherein the bank pattern and the barrier have a normal tapered shape.

12. The method according to claim 11, wherein the auxiliary electrode has a discontinuous top surface along a top surface of the insulating layer including the at least two dented portions.

13. The method according to claim 12, wherein the auxiliary electrode includes at least two holes corresponding to the at least two dented portions.

14. The method according to claim 12, wherein the bank pattern, the barrier, and the auxiliary electrode have protrusions extending over edges of the at least two dented portions of the insulating layer.

15. The method according to claim 14, wherein each of the protrusions of the bank pattern and the barrier has a width greater than a width of the protrusions of the auxiliary electrode.

16. The method according to claim 14, further comprising a step of forming an electrode layer on the second electrode, wherein the electrode layer is in contact with the second electrode and the auxiliary electrode.

17. The method according to claim 16, wherein the electrode layer contacts side and bottom surfaces of the auxiliary electrode, side surfaces of the at least two dented portions, and bottom surfaces of the protrusions of the bank pattern and the barrier.

18. The method according to claim 2, wherein a layer of a same material as the organic light-emitting layer is located on the barrier.

19. The method according to claim 1, wherein the at least two dented portions have one of a polygonal shape, a semicircular shape, and a semielliptical shape.

20. The method according to claim 1, wherein the at least two dented portions have a depth between 1 μm and a thickness of the insulating layer.

\* \* \* \* \*